(12) United States Patent
Cho et al.

(10) Patent No.: US 8,476,111 B2
(45) Date of Patent: Jul. 2, 2013

(54) INTEGRATED CIRCUIT PACKAGING SYSTEM WITH INTRA SUBSTRATE DIE AND METHOD OF MANUFACTURE THEREOF

(75) Inventors: NamJu Cho, Uiwang-si (KR); HeeJo Chi, Ichon-si (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 134 days.

(21) Appl. No.: 13/162,513

(22) Filed: Jun. 16, 2011

(65) Prior Publication Data

US 2012/0319263 A1  Dec. 20, 2012

(51) Int. Cl.
*H01L 21/00* (2006.01)

(52) U.S. Cl.
USPC .... 438/109; 438/122; 438/127; 257/E21.705; 257/668; 257/690

(58) Field of Classification Search
CPC .............................. H01L 25/065; H01L 21/98
USPC .................. 257/E21.705, E25.013, 690–692, 257/695, 675, 668, 680, 780; 438/109, 122, 438/106, 118, 121, 124, 127; 428/343, 355 EP
See application file for complete search history.

(56) References Cited

U.S. PATENT DOCUMENTS

| | | | |
|---|---|---|---|
| 6,020,626 A * | 2/2000 | Ohsawa et al. | 257/668 |
| 6,150,724 A * | 11/2000 | Wenzel et al. | 257/777 |
| 6,201,298 B1 * | 3/2001 | Sato et al. | 257/691 |
| 6,300,168 B1 * | 10/2001 | Takeuchi | 438/122 |
| 6,303,219 B1 * | 10/2001 | Sawamura et al. | 428/343 |
| 6,433,440 B1 * | 8/2002 | Ogino et al. | 257/784 |
| 6,501,164 B1 * | 12/2002 | Chen et al. | 257/686 |
| 6,713,856 B2 | 3/2004 | Tsai et al. | |
| 6,815,829 B2 * | 11/2004 | Shibata | 257/777 |
| 6,825,567 B1 * | 11/2004 | Wang et al. | 257/777 |
| 7,132,747 B2 * | 11/2006 | Kwon et al. | 257/724 |
| 7,198,980 B2 | 4/2007 | Jiang et al. | |
| 7,485,490 B2 | 2/2009 | Oh et al. | |
| 7,495,344 B2 | 2/2009 | Usui et al. | |
| 7,834,430 B2 | 11/2010 | Do et al. | |
| 7,915,724 B2 | 3/2011 | Ha et al. | |
| 7,944,039 B2 * | 5/2011 | Arai | 257/690 |
| 2009/0085178 A1 * | 4/2009 | Ha et al. | 257/666 |
| 2009/0230531 A1 | 9/2009 | Do et al. | |
| 2010/0237490 A1 * | 9/2010 | Chu et al. | 257/692 |
| 2011/0140258 A1 | 6/2011 | Do et al. | |

\* cited by examiner

*Primary Examiner* — Chris Chu
(74) *Attorney, Agent, or Firm* — Ishimaru & Associates LLP; I-Chang John Yang

(57) ABSTRACT

A method of manufacture of an integrated circuit packaging system includes: providing a substrate having a through hole; mounting an integrated circuit in the through hole, the integrated circuit having an inactive side and a vertical side; connecting a first interconnect in direct contact with the integrated circuit and the substrate; applying a wire-in-film adhesive around and above the integrated circuit leaving a portion of the vertical side and the inactive side exposed and covering a portion of the first interconnect; and mounting a chip above the integrated circuit and in direct contact with the wire-in-film adhesive.

10 Claims, 8 Drawing Sheets

INTEGRATED CIRCUIT PACKAGING SYSTEM WITH INTRA SUBSTRATE DIE AND METHOD OF MANUFACTURE THEREOF

TECHNICAL FIELD

The present invention relates generally to an integrated circuit packaging system and more particularly to a system for utilizing a substrate with an integrated circuit in an integrated circuit packaging system.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including:

The present invention provides an integrated circuit packaging system, including:

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
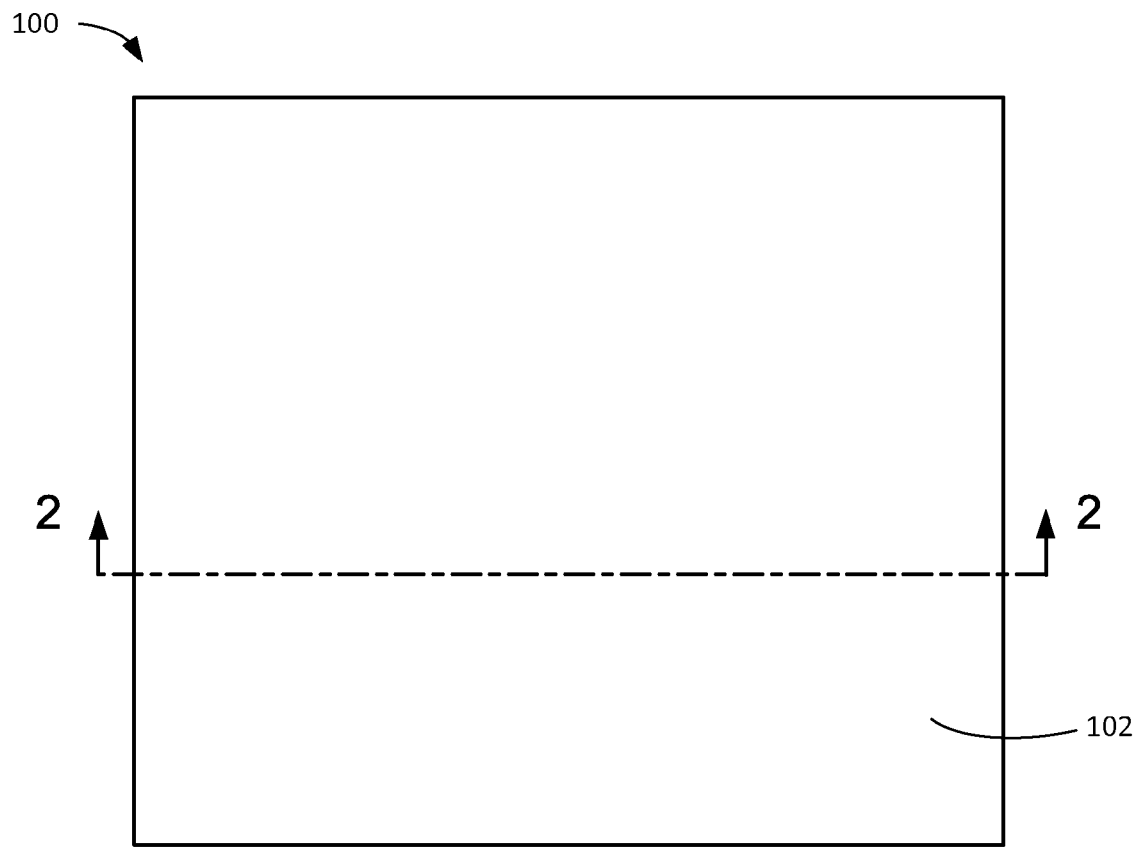
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an encapsulation 102. The encapsulation 102 is defined as a structure that protects components from moisture, dust and other contamination. The encapsulation 102 can be glob top, film assist molding, or other encasement structures.

As an exemplary illustration, the integrated circuit packaging system 100 can generally be used within a portable electronics device that requires a high level of functional integration, such as memory cards, universal serial bus memory, or embedded multimedia cards.

Figure 2:
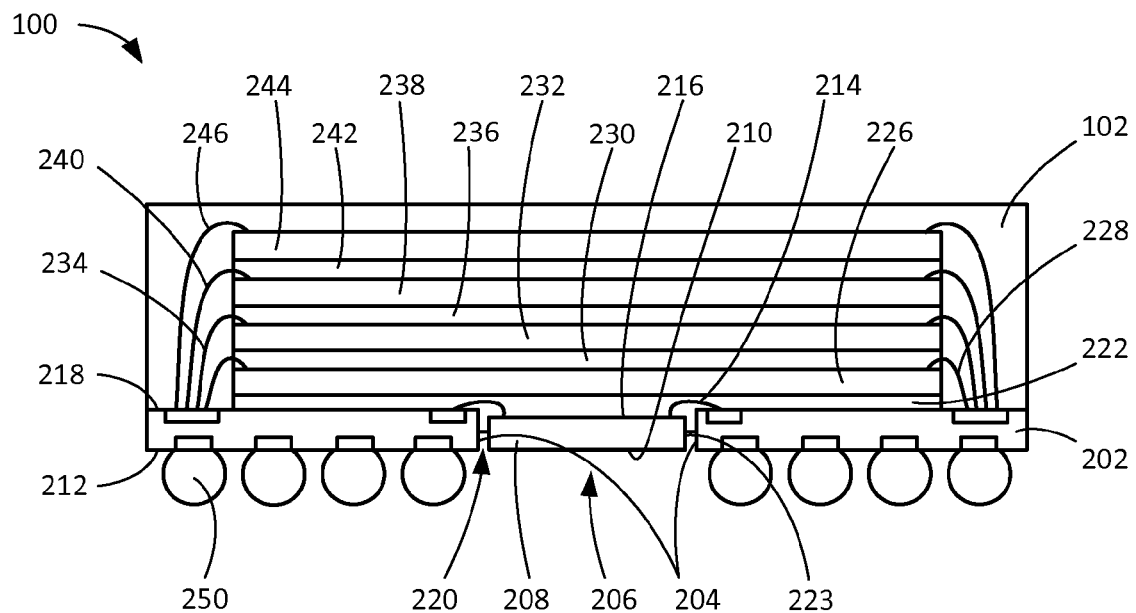
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202. The substrate 202 is defined as a structure capable of electrically connection, signal routing and internal isolation, and providing structural support for components to be mounted thereto. The substrate 202 can be but is not limited to laminated plastic or ceramic.

The substrate 202 is shown having sides 204 that face each other bounding a through hole 206. Between the sides 204 an integrated circuit 208 is positioned and without contact between the integrated circuit 208 and the sides 204. The integrated circuit 208 is depicted as a wire-bonded integrated circuit die with an inactive side 210 coplanar with a bottom surface 212 of the substrate 202.

The integrated circuit 208 is electrically connected to the substrate 202 with first interconnects 214 depicted as bond wires that are in direct contact with an active side 216 of the integrated circuit 208 and in direct contact with the substrate 202. The first interconnects 214 are defined as electrical connections via a singular structure. The active side 216 is defined as a surface having active circuitry. The active side 216 of the integrated circuit 208 is below a top surface 218 of the substrate 202. Between the integrated circuit 208 and the sides 204 of the substrate 202 there is a space 220 that is open, unfilled, void, or empty. The integrated circuit 208 is therefore exposed between the sides 204 of the substrate 202.

It has been discovered that positioning the integrated circuit 208 below the top surface 218 of the substrate 202 provides shorter wire sweeps eliminating inadvertent shorting and wire breakage and shorter package height due to reduced clearance needs of the first interconnects 214. Further, it has been discovered that positioning the integrated circuit 208 below the top surface 218 of the substrate 202 reduces costs of manufacture by reducing the amount of material used to manufacture the first interconnects 214. Yet further, it has been discovered that positioning the integrated circuit 208 within the through hole 206 of the substrate 202 allows for small die like memory controllers to be centrally located and easily better connected to other components in the integrated circuit packaging system 100.

The integrated circuit 208 is covered by a wire-in-film adhesive 222. The wire-in-film adhesive 222 is defined as a material that can be hardened after curing and can maintain a predetermined thickness. The wire-in-film adhesive 222 is depicted as a B-stage material. B-stage material is defined as a thermosetting resin that softens when heated and able to expand in the presence of certain fluids and may be cured by the cross-linking of polymers. The wire-in-film adhesive 222 can be pre-formed to a thickness less than the thickness of the substrate 202 or the integrated circuit 208. Pre-forming is defined as an intermediate stage of reaction of a thermosetting resin that is not in a liquid or fluid like state but is a moldable solid.

The wire-in-film adhesive 222 is in direct contact with the active side 216 of the integrated circuit 208 and is cured around the first interconnects 214. The wire-in-film adhesive 222 is also in direct contact with the top surface 218 of the substrate 202, with the sides 204 of the substrate 202, and with the integrated circuit 208 near the top surface 218 of the substrate 202. Further, vertical sides 223 of the integrated circuit 208 and the inactive side 210 of the integrated circuit 208 are exposed from the wire-in-film adhesive 222.

The inactive side 210 is shown fully exposed or 100% of the inactive side is exposed from the wire-in-film adhesive 222. The vertical sides 223 of the integrated circuit 208 can also be fully exposed from the wire-in-film adhesive 222 but are depicted as partially covered with the wire-in-film adhesive 222 to improve mechanical reliability and partially exposed from the wire-in-film adhesive 222 to improve heat dissipation. Active circuitry on the active side 216 should be fully covered by the wire-in-film adhesive 222 to ensure there is no moisture absorption and that the sensitive active components are protected.

It has been discovered that the wire-in-film adhesive 222 encasing portions of the integrated circuit 208 provide encasement protection for dust, moisture, and other environmental elements. It has been further discovered that the wire-in-film adhesive 222 encasing portions of the integrated circuit 208 provide high reliability for the integrated circuit 208, while leaving the integrated circuit 208 partially exposed provides increased thermal cooling and performance.

Above the substrate 202 and the integrated circuit 208 is a first chip 226 depicted as a wire-bonded integrated circuit chip having active circuitry on a top portion. The first chip 226 extends over, above, and laterally beyond the sides 204 of the substrate 202 that face each other and the integrated circuit 208.

The first chip 226 is electrically connected from above to the top surface 218 of the substrate 202 with second interconnects 228 depicted as bond wires that are in direct contact with the first chip 226 and in direct contact with the substrate 202. The first chip 226 is connected peripheral to the integrated circuit 208 and the first interconnects 214.

Above the first chip 226 is a first intermediate layer 230 depicted as a wire-in-film adhesive cured around portions of the second interconnects 228. Above the first intermediate layer 230 is a second chip 232 depicted as a wire-bonded integrated circuit chip having active circuitry on a top portion. The second chip 232 extends over, above, and laterally beyond the sides 204 of the substrate 202 that face each other and the integrated circuit 208, and can be in vertical alignment and coplanar with the first chip 226. Vertical alignment is defined as the mean location of mass of a first component along a vertical line of the mean location of mass of a second component.

The second chip 232 is electrically connected from above to the top surface 218 of the substrate 202 with third interconnects 234 depicted as bond wires that are in direct contact with the second chip 232 and in direct contact with the substrate 202. The second chip 232 is connected peripheral to the integrated circuit 208, the first interconnects 214, and the first chip 226.

It has been discovered that utilizing the integrated circuit 208 between the sides 204 and in combination with the first chip 226 and with the second chip 232 provides reduced package size and foot print. It has been further discovered that utilizing the integrated circuit 208 between the sides 204 and in combination with the first chip 226 and with the second chip 232 provides reduced interconnection length decreasing manufacturing costs and undesirable electric characteristics.

Above the first chip 226 and the second chip 232 is a second intermediate layer 236 depicted as a wire-in-film adhesive cured around portions of the third interconnects 234. Above the second intermediate layer 236 is a third chip 238 depicted as a wire-bonded integrated circuit chip having active circuitry on a top portion. The third chip 238 extends over, above, and laterally beyond the sides 204 of the substrate 202 that face each other and the integrated circuit 208, and can be in vertical alignment and coplanar with the first chip 226 and with the second chip 232.

The third chip 238 is electrically connected from above to the top surface 218 of the substrate 202 with fourth interconnects 240 depicted as bond wires that are in direct contact with the third chip 238 and in direct contact with the substrate 202. The third chip 238 is connected peripheral to the integrated circuit 208 and the first interconnects 214.

It has been discovered that utilizing the integrated circuit 208 between the sides 204 and in combination with the first chip 226, the second chip 232, and the third chip 238 provides reduced package size and foot print. It has been further discovered that utilizing the integrated circuit 208 between the sides 204 and in combination with the first chip 226, the second chip 232, and the third chip 238 provides reduced interconnection length decreasing manufacturing costs and undesirable electric characteristics.

Above the first chip 226, the second chip 232, and the third chip 238 is a third intermediate layer 242 depicted as a wire-in-film adhesive cured around portions of the fourth interconnects 240. Above the third intermediate layer 242 is a fourth chip 244 depicted as a wire-bonded integrated circuit chip having active circuitry on a top portion. The fourth chip 244 extends over, above, and laterally beyond the sides 204 of the substrate 202 that face each other and the integrated circuit 208, and can be in vertical alignment and coplanar with the first chip 226, with the second chip 232, and with the third chip 238.

The fourth chip 244 is electrically connected from above to the top surface 218 of the substrate 202 with fifth interconnects 246 depicted as bond wires that are in direct contact with the fourth chip 244 and in direct contact with the substrate 202. The fourth chip 244 is connected peripheral to the integrated circuit 208 and the first interconnects 214.

It has been discovered that utilizing the integrated circuit 208 between the sides 204 and in combination with the first chip 226, the second chip 232, the third chip 238, and the fourth chip 244 provides reduced package size and foot print. It has been further discovered that utilizing the integrated circuit 208 between the sides 204 and in combination with the first chip 226, the second chip 232, the third chip 238, and the fourth chip 244 provides reduced interconnection length decreasing manufacturing costs and undesirable electric characteristics.

The third interconnects 234 are depicted peripheral to the second interconnects 228. The fourth interconnects 240 are depicted peripheral to the second interconnects 228, and the third interconnects 234. The fifth interconnects 246 are depicted peripheral to the second interconnects 228, the third interconnects 234, and the fourth interconnects 240.

Above and around the first chip 226, the second chip 232, the third chip 238, and the fourth chip 244 is the encapsulation 102. The encapsulation 102 further encapsulates the second interconnects 228, the third interconnects 234, the fourth interconnects 240, and the fifth interconnects 246. The encapsulation 102 encapsulates portions of the top surface 218 of the substrate 202. Below the substrate 202 external interconnects 250, depicted as solder balls, are mounted.

Figure 3:
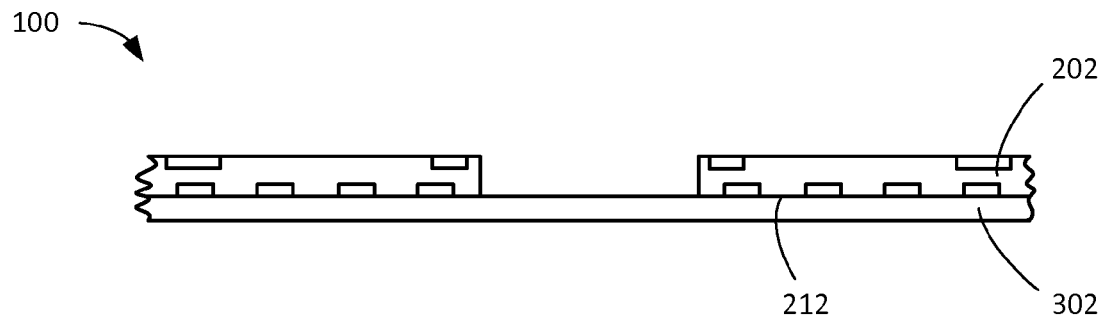
FIG. 3 is the integrated circuit packaging system of FIG. 2 after a coverlay tape attachment phase of manufacture.

Referring now to FIG. 3, therein is shown the integrated circuit packaging system 100 of FIG. 2 after a coverlay tape attachment phase of manufacture. The integrated circuit packaging system 100 is shown having the substrate 202 with a coverlay tape 302 attached to the bottom surface 212.

Figure 4:
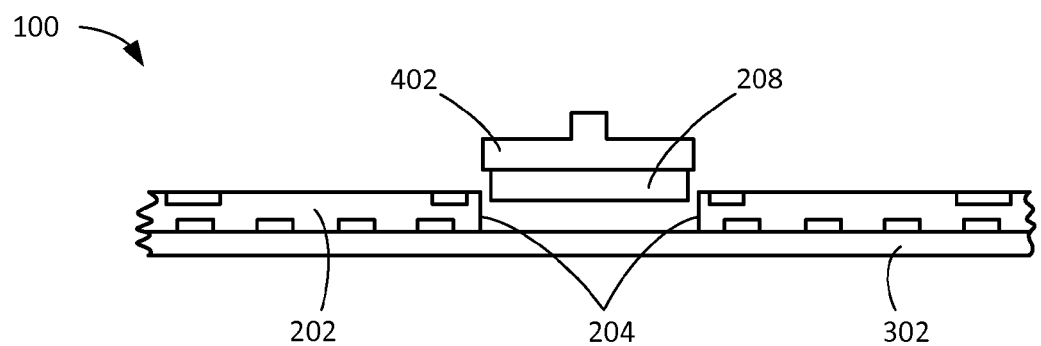
FIG. 4 is the integrated circuit packaging system of FIG. 2 in an intra-substrate die attach phase of manufacture.

Referring now to FIG. 4, therein is shown the integrated circuit packaging system 100 of FIG. 2 in an intra-substrate die attach phase of manufacture. The integrated circuit packaging system 100 is shown having the integrated circuit 208 being placed between the sides 204 of the substrate 202. A placement apparatus 402 will position the integrated circuit 208 between the sides 204 and on the coverlay tape 302.

Figure 5:
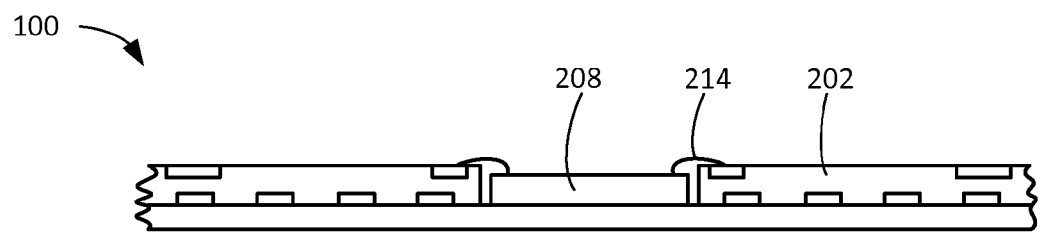
FIG. 5 is the integrated circuit packaging system of FIG. 2 after a first wire bonding phase of manufacture.

Referring now to FIG. 5, therein is shown the integrated circuit packaging system 100 of FIG. 2 after a first wire bonding phase of manufacture. The integrated circuit packaging system 100 is shown having the first interconnects 214 connecting the integrated circuit 208 to the substrate 202.

Figure 6:
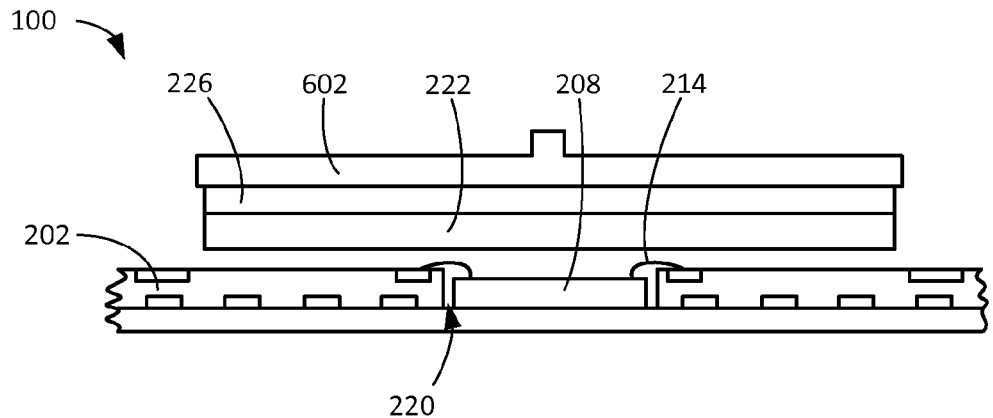
FIG. 6 is the integrated circuit packaging system of FIG. 2 in a first upper die attachment phase of manufacture.

Referring now to FIG. 6, therein is shown the integrated circuit packaging system 100 of FIG. 2 in a first upper die attachment phase of manufacture. The integrated circuit packaging system 100 is shown having the first chip 226 attached to a placement apparatus 602. The first chip 226 is depicted with the wire-in-film adhesive 222 attached below the first chip 226 before contacting the integrated circuit 208. The first chip 226 with the wire-in-film adhesive 222 is lowered onto the integrated circuit 208 around the first interconnects 214 and will fill the space 220 and contact the substrate 202.

Figure 7:
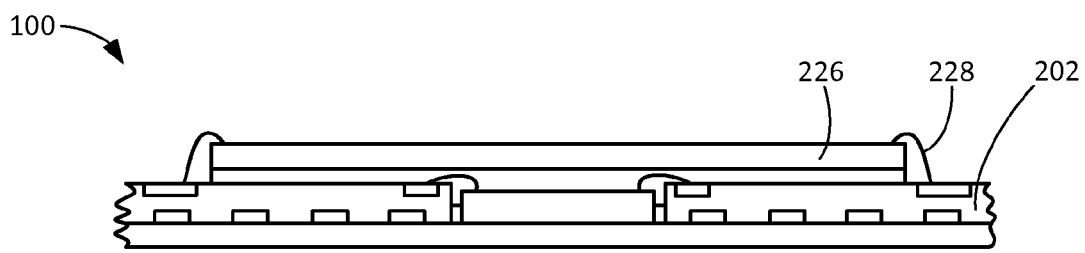
FIG. 7 is the integrated circuit packaging system of FIG. 2 after a second wire bonding phase of manufacture.

Referring now to FIG. 7, therein is shown the integrated circuit packaging system 100 of FIG. 2 after a second wire bonding phase of manufacture. The integrated circuit packaging system 100 is shown having the second interconnects 228 in direct contact with the first chip 226 and with the substrate 202.

Figure 8:
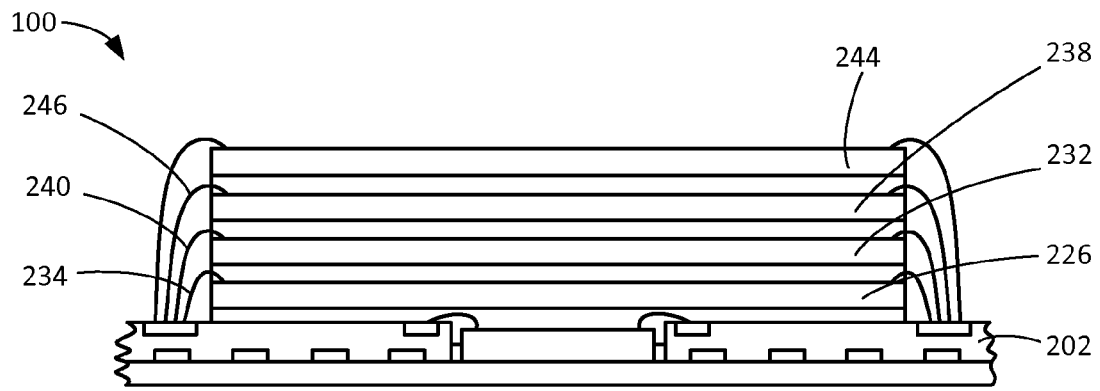
FIG. 8 is the integrated circuit packaging system of FIG. 2 after a fifth wire bonding phase of manufacture.

Referring now to FIG. 8, therein is shown the integrated circuit packaging system 100 of FIG. 2 after a fifth wire bonding phase of manufacture. The integrated circuit packaging system 100 is shown having the second chip 232, the third chip 238, and the fourth chip 244 mounted above the first chip 226. Also the second chip 232 is shown connected to the substrate 202 with the second interconnects 234, the third chip 238 is shown connected to the substrate 202 with the fourth interconnects 240, and the fourth chip 244 is shown connected to the substrate 202 with the fifth interconnects 246.

Figure 9:
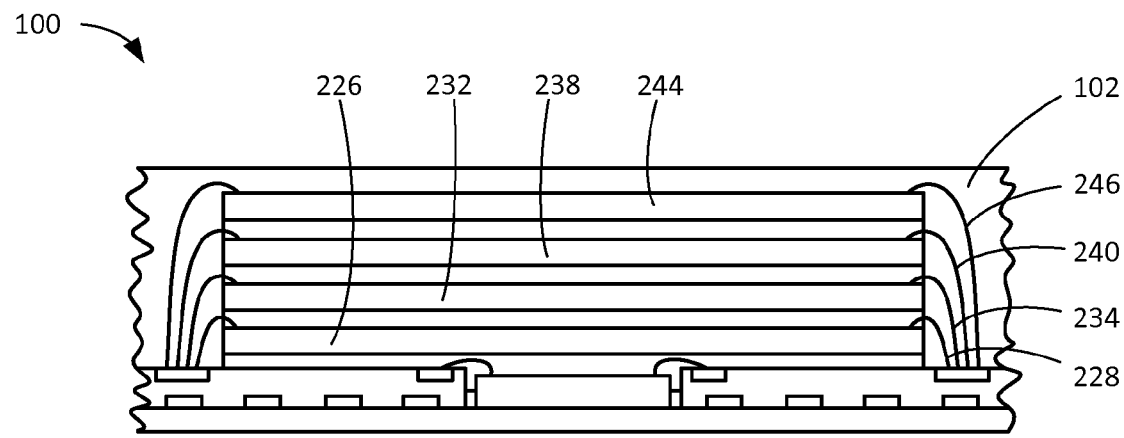
FIG. 9 is the integrated circuit packaging system of FIG. 2 after a mold phase of manufacture.

Referring now to FIG. 9, therein is shown the integrated circuit packaging system 100 of FIG. 2 after a mold phase of manufacture. The integrated circuit packaging system 100 is shown having the encapsulation 102 above and around the first chip 226, the second chip 232, the third chip 238, and the fourth chip 244. The encapsulation 102 further encapsulates the second interconnects 228, the third interconnects 234, the fourth interconnects 240, and the fifth interconnects 246.

Figure 10:
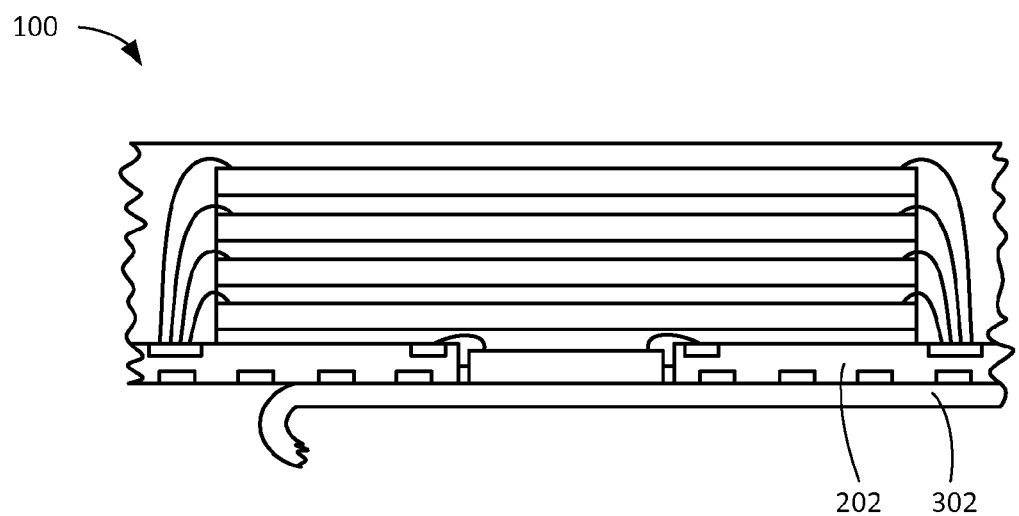
FIG. 10 is the integrated circuit packaging system of FIG. 2 in a de-taping phase of manufacture.

Referring now to FIG. 10, therein is shown of the integrated circuit packaging system 100 of FIG. 2 in a de-taping phase of manufacture. The integrated circuit packaging system 100 is shown having the coverlay tape 302 removed from the substrate with a mechanical de-taping process or with an ultra violet cure separation from the substrate 202.

Figure 11:
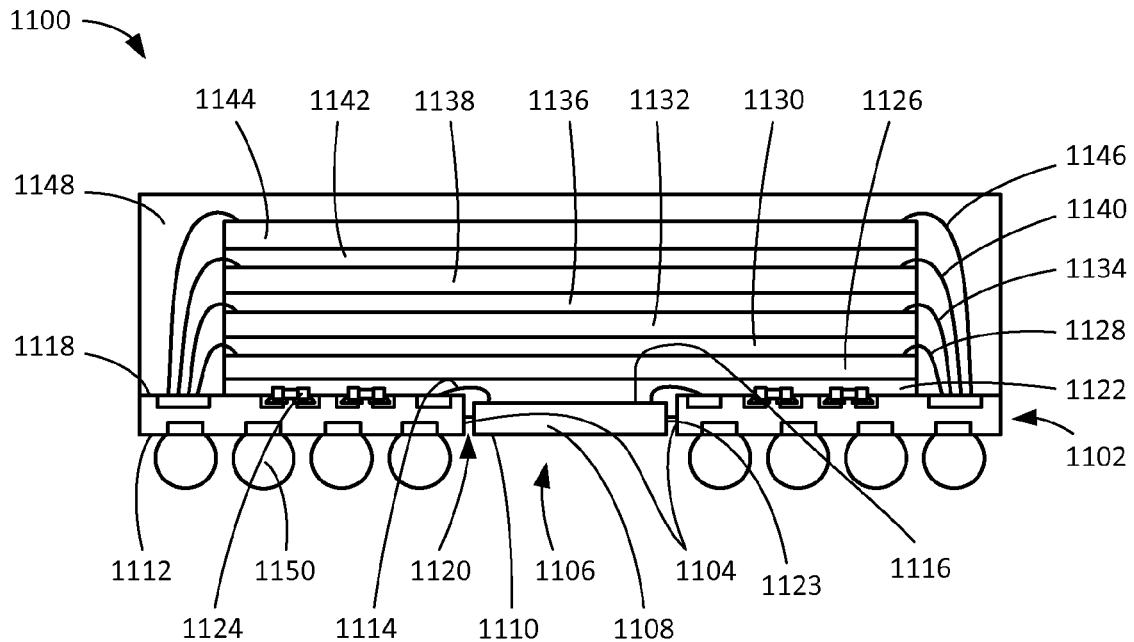
FIG. 11 is a cross-sectional view of an integrated circuit packaging system in a second embodiment of the present invention.

Referring now to FIG. 11, therein is shown a cross-sectional view of an integrated circuit packaging system 1100 in a second embodiment of the present invention. The integrated circuit packaging system 1100 is shown having a substrate 1102. The substrate 1102 is defined as a structure capable of electrically connection, signal routing, and providing structural support for components to be mounted thereto. The substrate 1102 can be but is not limited to laminated plastic or ceramic.

The substrate 1102 is shown having sides 1104 that face each other bounding a through hole 1106 of the substrate 1102. Between the sides 1104 an integrated circuit 1108 is positioned and without contact between the integrated circuit 1108 and the sides 1104. The integrated circuit 1108 is depicted as a wire-bonded integrated circuit die with an inactive side 1110 coplanar with a bottom surface 1112 of the substrate 1102.

The integrated circuit 1108 is electrically connected to the substrate 1102 with first interconnects 1114 depicted as bond wires that are in direct contact with an active side 1116 of the integrated circuit 1108 and in direct contact with the substrate 1102. The active side 1116 is defined as a surface having active circuitry. Active circuitry is defined as including transistor elements. The active side 1116 of the integrated circuit 1108 is below a top surface 1118 of the substrate 1102. Between the integrated circuit 1108 and the sides 1104 of the substrate 1102 there is a space 1120 that is open, unfilled, void, or empty. The integrated circuit 1108 is therefore exposed between the sides 1104 of the substrate 1102.

It has been discovered that positioning the integrated circuit 1108 below the top surface 1118 of the substrate 1102 provides shorter wire sweeps eliminating inadvertent shorting and wire breakage and shorter package height due to reduced clearance needs of the first interconnects 1114. Further, it has been discovered that positioning the integrated circuit 1108 below the top surface 1118 of the substrate 1102 reduces costs of manufacture by reducing the amount of material used to manufacture the first interconnects 1114. Yet further, it has been discovered that positioning the integrated circuit 1108 below the top surface 1118 of the substrate 1102 reduces parasitic inductance during high frequency data transmission by reducing the length of the first interconnects 1114.

The integrated circuit 1108 is covered by a wire-in-film adhesive 1122. The wire-in-film adhesive 1122 is defined as a material that can be hardened after curing and can maintain a predetermined thickness. The wire-in-film adhesive 1122 is depicted a B-stage material. B-stage material is defined as a thermosetting resin that softens when heated and able to expand in the presence of certain fluids and may be cured by the cross-linking of polymers. The wire-in-film adhesive 1122 can be pre-formed to a thickness less than the thickness of the substrate 1102 or the integrated circuit 1108. Preforming is defined as an intermediate stage of reaction of a thermosetting resin that is not in a liquid or fluid like state but is a moldable solid.

The wire-in-film adhesive 1122 is in direct contact with the active side 1116 of the integrated circuit 1108 and is cured around the first interconnects 1114. The wire-in-film adhesive 1122 is also in direct contact with the top surface 1118 of the substrate 1102, with the sides 1104 of the substrate 1102, and with the integrated circuit 1108 near the top surface 1118 of the substrate 1102. Further, vertical sides 1123 of the integrated circuit 1108 and the inactive side 1110 of the integrated circuit 1108 are exposed from the wire-in-film adhesive 1122.

The inactive side 1110 is shown fully exposed or 100% of the inactive side is exposed from the wire-in-film adhesive 1122. The vertical sides 1123 of the integrated circuit 1108 can also be fully exposed from the wire-in-film adhesive 1122 but are depicted as partially covered with the wire-in-film adhesive 1122 to improve mechanical reliability and partially exposed from the wire-in-film adhesive 1122 to improve heat dissipation. Active circuitry on the active side 1116 should be fully covered by the wire-in-film adhesive 1122 to ensure there is no moisture absorption and that the sensitive active components are protected.

It has been discovered that the wire-in-film adhesive 1122 encasing portions of the integrated circuit 1108 provide encasement protection for dust, moisture, and other environmental elements. It has been further discovered that the wire-in-film adhesive 1122 encasing portions of the integrated circuit 1108 provide high reliability for the integrated circuit 1108, while leaving the integrated circuit 1108 partially exposed provides increased thermal cooling and performance.

Embedded within the wire-in-film adhesive 1122 are components 1124 depicted as passive components mounted to the top surface 1118 of the substrate 1102. The components 1124 can be mounted to extend above and below the top surface 1118 of the substrate 1102. Above the substrate 1102 and the integrated circuit 1108 is a first chip 1126 depicted as a wire-bonded integrated circuit chip having active circuitry on a top portion. The first chip 1126 extends over, above, and laterally beyond the sides 1104 of the substrate 1102 that face each other, the integrated circuit 1108, and the components 1124.

The first chip 1126 is electrically connected from above to the top surface 1118 of the substrate 1102 with second interconnects 1128 depicted as bond wires that are in direct contact with the first chip 1126 and in direct contact with the substrate 1102. The first chip 1126 is connected peripheral to the integrated circuit 1108, the components 1124, and the first interconnects 1114.

Above the first chip 1126 is a first intermediate layer 1130 depicted as a wire-in-film adhesive cured around portions of the second interconnects 1128. Above the first intermediate layer 1130 is a second chip 1132 depicted as a wire-bonded integrated circuit chip having active circuitry on a top portion. The second chip 1132 extends over, above, and laterally beyond the sides 1104 of the substrate 1102 that face each other, the integrated circuit 1108, and the components 1124 and is in vertical alignment and coplanar with the first chip

1126. Vertical alignment is defined as the mean location of mass of a first component along a vertical line of the mean location of mass of a second component.

The second chip 1132 is electrically connected from above to the top surface 1118 of the substrate 1102 with third interconnects 1134 depicted as bond wires that are in direct contact with the second chip 1132 and in direct contact with the substrate 1102. The second chip 1132 is connected peripheral to the integrated circuit 1108, the components 1124, the first interconnects 1114, and the first chip 1126.

It has been discovered that utilizing the integrated circuit 1108 between the sides 1104 and in combination with the first chip 1126 and with the second chip 1132 provides reduced package size and foot print. It has been further discovered that utilizing the integrated circuit 1108 between the sides 1104 and in combination with the first chip 1126 and with the second chip 1132 provides reduced interconnection length decreasing manufacturing costs and undesirable electric characteristics.

Above the first chip 1126 and the second chip 1132 is a second intermediate layer 1136 depicted as a wire-in-film adhesive cured around portions of the third interconnects 1134. Above the second intermediate layer 1136 is a third chip 1138 depicted as a wire-bonded integrated circuit chip having active circuitry on a top portion. The third chip 1138 extends over, above, and laterally beyond the sides 1104 of the substrate 1102 that face each other, the integrated circuit 1108, and the components 1124 and is in vertical alignment and coplanar with the first chip 1126 and with the second chip 1132.

The third chip 1138 is electrically connected from above to the top surface 1118 of the substrate 1102 with fourth interconnects 1140 depicted as bond wires that are in direct contact with the third chip 1138 and in direct contact with the substrate 1102. The third chip 1138 is connected peripheral to the integrated circuit 1108, the components 1124, and the first interconnects 1114.

It has been discovered that utilizing the integrated circuit 1108 between the sides 1104 and in combination with the first chip 1126, the second chip 1132, and the third chip 1138 provides reduced package size and foot print. It has been further discovered that utilizing the integrated circuit 1108 between the sides 1104 and in combination with the first chip 1126, the second chip 1132, and the third chip 1138 provides reduced interconnection length decreasing manufacturing costs and undesirable electric characteristics.

Above the first chip 1126, the second chip 1132, and the third chip 1138 is a third intermediate layer 1142 depicted as a wire-in-film adhesive cured around portions of the fourth interconnects 1140. Above the third intermediate layer 1142 is a fourth chip 1144 depicted as a wire-bonded integrated circuit chip having active circuitry on a top portion. The fourth chip 1144 extends over, above, and laterally beyond the sides 1104 of the substrate 1102 that face each other, the integrated circuit 1108, and the components 1124 and is in vertical alignment and coplanar with the first chip 1126, with the second chip 1132, and with the third chip 1138.

The fourth chip 1144 is electrically connected from above to the top surface 1118 of the substrate 1102 with fifth interconnects 1146 depicted as bond wires that are in direct contact with the fourth chip 1144 and in direct contact with the substrate 1102. The fourth chip 1144 is connected peripheral to the integrated circuit 1108, the components 1124, and the first interconnects 1114.

It has been discovered that utilizing the integrated circuit 1108 between the sides 1104 and in combination with the first chip 1126, the second chip 1132, the third chip 1138, and the fourth chip 1144 provides reduced package size and foot print. It has been further discovered that utilizing the integrated circuit 1108 between the sides 1104 and in combination with the first chip 1126, the second chip 1132, the third chip 1138, and the fourth chip 1144 provides reduced interconnection length decreasing manufacturing costs and undesirable electric characteristics.

The third interconnects 1134 are depicted peripheral to the second interconnects 1128. The fourth interconnects 1140 are depicted peripheral to the second interconnects 1128, and the third interconnects 1134. The fifth interconnects 1146 are depicted peripheral to the second interconnects 1128, the third interconnects 1134, and the fourth interconnects 1140.

Above and around the first chip 1126, the second chip 1132, the third chip 1138, and the fourth chip 1144 is an encapsulation 1148. The encapsulation 1148 is defined as a structure that protects sensitive components from moisture, dust and other contamination. The encapsulation 1148 can be glob top, film assist molding, or other encasement structures.

The encapsulation 1148 further encapsulates the second interconnects 1128, the third interconnects 1134, the fourth interconnects 1140, and the fifth interconnects 1146. The encapsulation 1148 encapsulates portions of the top surface 1118 of the substrate 1102. Below the substrate 1102 external interconnects 1150, depicted as solder balls, are mounted.

Figure 12:
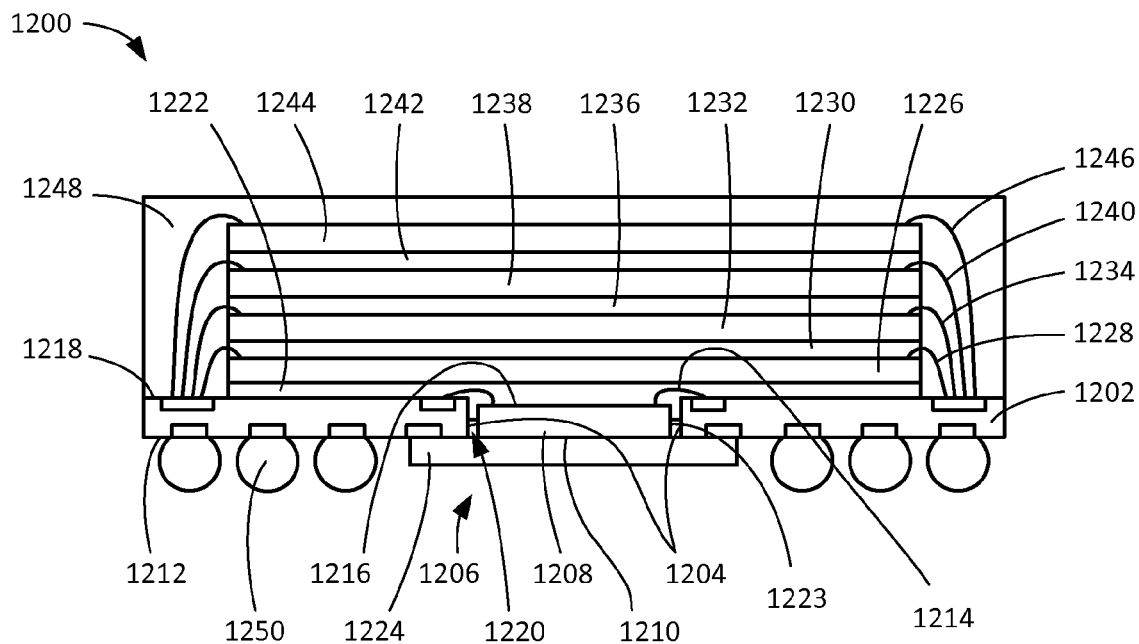
FIG. 12 is a cross-sectional view of an integrated circuit packaging system in a third embodiment of the present invention.

Referring now to FIG. 12, therein is shown a cross-sectional view of an integrated circuit packaging system 1200 in a third embodiment of the present invention. The integrated circuit packaging system 1200 is shown having a substrate 1202. The substrate 1202 is defined as a structure capable of electrically connection, signal routing, and providing structural support for components to be mounted thereto. The substrate 1202 can be but is not limited to laminated plastic or ceramic.

The substrate 1202 is shown having sides 1204 that face each other bounding a through hole 1206 of the substrate 1202. Between the sides 1204 an integrated circuit 1208 is positioned and without contact between the integrated circuit 1208 and the sides 1204. The integrated circuit 1208 is depicted as a wire-bonded integrated circuit die with an inactive side 1210 coplanar with a bottom surface 1212 of the substrate 1202.

The integrated circuit 1208 is electrically connected to the substrate 1202 with first interconnects 1214 depicted as bond wires that are in direct contact with an active side 1216 of the integrated circuit 1208 and in direct contact with the substrate 1202. The active side 1216 is defined as a surface having active circuitry. Active circuitry is defined as including transistor elements. The active side 1216 of the integrated circuit 1208 is below a top surface 1218 of the substrate 1202. Between the integrated circuit 1208 and the sides 1204 of the substrate 1202 there is a space 1220 that is open, unfilled, void, or empty. The integrated circuit 1208 is therefore exposed between the sides 1204 of the substrate 1202.

It has been discovered that positioning the integrated circuit 1208 below the top surface 1218 of the substrate 1202 provides shorter wire sweeps eliminating inadvertent shorting and wire breakage and shorter package height due to reduced clearance needs of the first interconnects 1214. Further, it has been discovered that positioning the integrated circuit 1208 below the top surface 1218 of the substrate 1202 reduces costs of manufacture by reducing the amount of material used to manufacture the first interconnects 1214. Yet further, it has been discovered that positioning the integrated circuit 1208 below the top surface 1218 of the substrate 1202 reduces parasitic inductance during high frequency data transmission by reducing the length of the first interconnects 1214.

The integrated circuit 1208 is covered by a wire-in-film adhesive 1222. The wire-in-film adhesive 1222 is defined as a material that can be hardened after curing and can maintain a predetermined thickness. The wire-in-film adhesive 1222 is depicted as a B-stage material. B-stage material is defined as a thermosetting resin that softens when heated and able to expand in the presence of certain fluids and may be cured by the cross-linking of polymers. The wire-in-film adhesive 1222 can be pre-formed to a thickness less than the thickness of the substrate 1202 or the integrated circuit 1208. Pre-forming is defined as an intermediate stage of reaction of a thermosetting resin that is not in a liquid or fluid like state but is a moldable solid.

The wire-in-film adhesive 1222 is in direct contact with the active side 1216 of the integrated circuit 1208 and is cured around the first interconnects 1214. The wire-in-film adhesive 1222 is also in direct contact with the top surface 1218 of the substrate 1202, with the sides 1204 of the substrate 1202, and with the integrated circuit 1208 near the top surface 1218 of the substrate 1202. Further, vertical sides 1223 of the integrated circuit 1208 and the inactive side 1210 of the integrated circuit 1208 are exposed from the wire-in-film adhesive 1222.

The inactive side 1210 is shown fully exposed or 100% of the inactive side is exposed from the wire-in-film adhesive 1222. The vertical sides 1223 of the integrated circuit 1208 can also be fully exposed from the wire-in-film adhesive 1222 but are depicted as partially covered with the wire-in-film adhesive 1222 to improve mechanical reliability and partially exposed from the wire-in-film adhesive 1222 to improve heat dissipation. Active circuitry on the active side 1216 should be fully covered by the wire-in-film adhesive 1222 to ensure there is no moisture absorption and that the sensitive active components are protected.

It has been discovered that the wire-in-film adhesive 1222 encasing portions of the integrated circuit 1208 provide encasement protection for dust, moisture, and other environmental elements. It has been further discovered that the wire-in-film adhesive 1222 encasing portions of the integrated circuit 1208 provide high reliability for the integrated circuit 1208, while leaving the integrated circuit 1208 partially exposed provides increased thermal cooling and performance.

Attached to the inactive side 1210 is a heat sink 1224. A heat sink 1224 is defined as a material having high thermal conductivity and designed to increase surface area for heat dissipation. The heat sink 1224 can be mounted in direct contact with the inactive side 1210 of the integrated circuit 1208 and in direct contact with the substrate 1202. The heat sink 1224 is depicted as extending laterally beyond the sides 1204, the integrated circuit 1208, and the first interconnects 1214.

Above the substrate 1202 and the integrated circuit 1208 is a first chip 1226 depicted as a wire-bonded integrated circuit chip having active circuitry on a top portion. The first chip 1226 extends over, above, and laterally beyond the sides 1204 of the substrate 1202 that face each other, the integrated circuit 1208, and the heat sink 1224.

It has been discovered that positioning the integrated circuit 1208 within the through hole 1206 allows the heat sink 1224 to be mounted to the inactive side 1210 and to the substrate 1202 increasing structural rigidity. It has been further discovered that positioning the integrated circuit 1208 between the sides 1204 allows the heat sink 1224 to be mounted to best reduce package size and height.

The first chip 1226 is electrically connected from above to the top surface 1218 of the substrate 1202 with second interconnects 1228 depicted as bond wires that are in direct contact with the first chip 1226 and in direct contact with the substrate 1202. The first chip 1226 is connected peripheral to the integrated circuit 1208, the heat sink 1224, and the first interconnects 1214.

Above the first chip 1226 is a first intermediate layer 1230 depicted as a wire-in-film adhesive cured around portions of the second interconnects 1228. Above the first intermediate layer 1230 is a second chip 1232 depicted as a wire-bonded integrated circuit chip having active circuitry on a top portion. The second chip 1232 extends over, above, and laterally beyond the sides 1204 of the substrate 1202 that face each other, the integrated circuit 1208, and the heat sink 1224 and is in vertical alignment and coplanar with the first chip 1226. Vertical alignment is defined as the mean location of mass of a first component along a vertical line of the mean location of mass of a second component.

The second chip 1232 is electrically connected from above to the top surface 1218 of the substrate 1202 with third interconnects 1234 depicted as bond wires that are in direct contact with the second chip 1232 and in direct contact with the substrate 1202. The second chip 1232 is connected peripheral to the integrated circuit 1208, the heat sink 1224, the first interconnects 1214, and the first chip 1226.

It has been discovered that utilizing the integrated circuit 1208 between the sides 1204 and in combination with the first chip 1226 and with the second chip 1232 provides reduced package size and foot print. It has been further discovered that utilizing the integrated circuit 1208 between the sides 1204 and in combination with the first chip 1226 and with the second chip 1232 provides reduced interconnection length decreasing manufacturing costs and undesirable electric characteristics.

Above the first chip 1226 and the second chip 1232 is a second intermediate layer 1236 depicted as a wire-in-film adhesive cured around portions of the third interconnects 1234. Above the second intermediate layer 1236 is a third chip 1238 depicted as a wire-bonded integrated circuit chip having active circuitry on a top portion. The third chip 1238 extends over, above, and laterally beyond the sides 1204 of the substrate 1202 that face each other, the integrated circuit 1208, and the heat sink 1224 and is in vertical alignment and coplanar with the first chip 1226 and with the second chip 1232.

The third chip 1238 is electrically connected from above to the top surface 1218 of the substrate 1202 with fourth interconnects 1240 depicted as bond wires that are in direct contact with the third chip 1238 and in direct contact with the substrate 1202. The third chip 1238 is connected peripheral to the integrated circuit 1208, the heat sink 1224, and the first interconnects 1214.

It has been discovered that utilizing the integrated circuit 1208 between the sides 1204 and in combination with the first chip 1226, the second chip 1232, and the third chip 1238 provides reduced package size and foot print. It has been further discovered that utilizing the integrated circuit 1208 between the sides 1204 and in combination with the first chip 1226, the second chip 1232, and the third chip 1238 provides reduced interconnection length decreasing manufacturing costs and undesirable electric characteristics.

Above the first chip 1226, the second chip 1232, and the third chip 1238 is a third intermediate layer 1242 depicted as a wire-in-film adhesive cured around portions of the fourth interconnects 1240. Above the third intermediate layer 1242 is a fourth chip 1244 depicted as a wire-bonded integrated circuit chip having active circuitry on a top portion. The fourth chip 1244 extends over, above, and laterally beyond the sides 1204 of the substrate 1202 that face each other, the integrated circuit 1208, and the heat sink 1224 and is in vertical alignment and coplanar with the first chip 1226, with the second chip 1232, and with the third chip 1238.

The fourth chip 1244 is electrically connected from above to the top surface 1218 of the substrate 1202 with fifth interconnects 1246 depicted as bond wires that are in direct contact with the fourth chip 1244 and in direct contact with the substrate 1202. The fourth chip 1244 is connected peripheral to the integrated circuit 1208, the heat sink 1224, and the first interconnects 1214.

It has been discovered that utilizing the integrated circuit 1208 between the sides 1204 and in combination with the first chip 1226, the second chip 1232, the third chip 1238, and the fourth chip 1244 provides reduced package size and foot print. It has been further discovered that utilizing the integrated circuit 1208 between the sides 1204 and in combination with the first chip 1226, the second chip 1232, the third chip 1238, and the fourth chip 1244 provides reduced interconnection length decreasing manufacturing costs and undesirable electric characteristics.

The third interconnects 1234 are depicted peripheral to the second interconnects 1228. The fourth interconnects 1240 are depicted peripheral to the second interconnects 1228, and the third interconnects 1234. The fifth interconnects 1246 are depicted peripheral to the second interconnects 1228, the third interconnects 1234, and the fourth interconnects 1240.

Above and around the first chip 1226, the second chip 1232, the third chip 1238, and the fourth chip 1244 is an encapsulation 1248. The encapsulation 1248 is defined as a structure that protects sensitive components from moisture, dust and other contamination. The encapsulation 1248 can be glob top, film assist molding, or other encasement structures.

The encapsulation 1248 further encapsulates the second interconnects 1228, the third interconnects 1234, the fourth interconnects 1240, and the fifth interconnects 1246. The encapsulation 1248 encapsulates portions of the top surface 1218 of the substrate 1202. Below the substrate 1202 external interconnects 1250, depicted as solder balls, are mounted.

Figure 13:
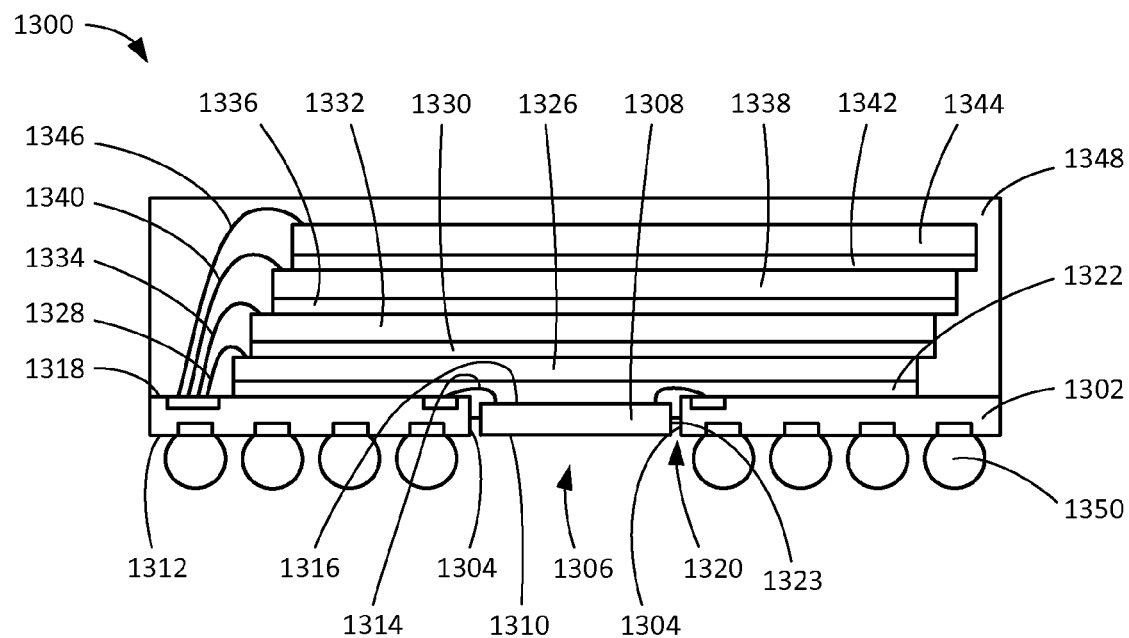
FIG. 13 is a cross-sectional view of an integrated circuit packaging system in a fourth embodiment of the present invention.

Referring now to FIG. 13, therein is shown a cross-sectional view of an integrated circuit packaging system 1300 in a fourth embodiment of the present invention. The integrated circuit packaging system 1300 is shown having a substrate 1302. The substrate 1302 is defined as a structure capable of electrically connection, signal routing, and providing structural support for components to be mounted thereto. The substrate 1302 can be but is not limited to laminated plastic or ceramic.

The substrate 1302 is shown having sides 1304 that face each other bounding a through hole 1306 of the substrate 1302. Between the sides 1304 an integrated circuit 1308 is positioned and without contact between the integrated circuit 1308 and the sides 1304. The integrated circuit 1308 is depicted as a wire-bonded integrated circuit die with an inactive side 1310 coplanar with a bottom surface 1312 of the substrate 1302.

The integrated circuit 1308 is electrically connected to the substrate 1302 with first interconnects 1314 depicted as bond wires that are in direct contact with an active side 1316 of the integrated circuit 1308 and in direct contact with the substrate 1302. The active side 1316 is defined as a surface having active circuitry. Active circuitry is defined as including transistor elements. The active side 1316 of the integrated circuit 1308 is below a top surface 1318 of the substrate 1302. Between the integrated circuit 1308 and the sides 1304 of the substrate 1302 there is a space 1320 that is open, unfilled, void, or empty. The integrated circuit 1308 is therefore exposed between the sides 1304 of the substrate 1302.

It has been discovered that positioning the integrated circuit 1308 below the top surface 1318 of the substrate 1302 provides shorter wire sweeps eliminating inadvertent shorting and wire breakage and shorter package height due to reduced clearance needs of the first interconnects 1314. Further, it has been discovered that positioning the integrated circuit 1308 below the top surface 1318 of the substrate 1302 reduces costs of manufacture by reducing the amount of material used to manufacture the first interconnects 1314. Yet further, it has been discovered that positioning the integrated circuit 1308 below the top surface 1318 of the substrate 1302 reduces parasitic inductance during high frequency data transmission by reducing the length of the first interconnects 1314.

The integrated circuit 1308 is covered by a wire-in-film adhesive 1322. The wire-in-film adhesive 1322 is defined as a material that can be hardened after curing and can maintain a predetermined thickness. The wire-in-film adhesive 1322 is depicted as a B-stage material. B-stage material is defined as a thermosetting resin that softens when heated and able to expand in the presence of certain fluids and may be cured by the cross-linking of polymers. The wire-in-film adhesive 1322 can be pre-formed to a thickness less than the thickness of the substrate 1302 or the integrated circuit 1308. Pre-forming is defined as an intermediate stage of reaction of a thermosetting resin that is not in a liquid or fluid like state but is a moldable solid.

The wire-in-film adhesive 1322 is in direct contact with the active side 1316 of the integrated circuit 1308 and is cured around the first interconnects 1314. The wire-in-film adhesive 1322 is also in direct contact with the top surface 1318 of the substrate 1302, with the sides 1304 of the substrate 1302, and with the integrated circuit 1308 near the top surface 1318 of the substrate 1302. Further, vertical sides 1323 of the integrated circuit 1308 and the inactive side 1310 of the integrated circuit 1308 are exposed from the wire-in-film adhesive 1322.

The inactive side 1310 is shown fully exposed or 100% of the inactive side is exposed from the wire-in-film adhesive 1322. The vertical sides 1323 of the integrated circuit 1308 can also be fully exposed from the wire-in-film adhesive 1322 but are depicted as partially covered with the wire-in-film adhesive 1322 to improve mechanical reliability and partially exposed from the wire-in-film adhesive 1322 to improve heat dissipation. Active circuitry on the active side 1316 should be fully covered by the wire-in-film adhesive 1322 to ensure there is no moisture absorption and that the sensitive active components are protected.

It has been discovered that the wire-in-film adhesive 1322 encasing portions of the integrated circuit 1308 provide encasement protection for dust, moisture, and other environmental elements. It has been further discovered that the wire-in-film adhesive 1322 encasing portions of the integrated circuit 1308 provide high reliability for the integrated circuit 1308, while leaving the integrated circuit 1308 partially exposed provides increased thermal cooling and performance.

Above the substrate 1302 and the integrated circuit 1308 is a first chip 1326 depicted as a wire-bonded integrated circuit chip having active circuitry on a top portion. The first chip

1326 extends over, above, and laterally beyond the sides 1304 of the substrate 1302 that face each other and the integrated circuit 1308.

The first chip 1326 is electrically connected from above to the top surface 1318 of the substrate 1302 with second interconnects 1328 depicted as bond wires that are in direct contact with the first chip 1326 and in direct contact with the substrate 1302. The first chip 1326 can be connected along a single side peripheral to the integrated circuit 1308 and the first interconnects 1314.

Above the first chip 1326 is a first intermediate layer 1330 depicted as an integrated circuit attach adhesive. Above the first intermediate layer 1330 is a second chip 1332 depicted as a wire-bonded integrated circuit chip having active circuitry on a top portion. The second chip 1332 extends over, above, and laterally beyond the sides 1304 of the substrate 1302 that face each other, the integrated circuit 1308 and is horizontally offset along with the first intermediate layer 1330 from the first chip 1326. The second chip 1332 and the first intermediate layer 1330 are sufficiently offset from the first chip 1326 to provide room for the second interconnects 1328 to connect to the first chip 1326 without obstruction from the second chip 1332 and the first intermediate layer 1330.

The second chip 1332 is electrically connected from above to the top surface 1318 of the substrate 1302 with third interconnects 1334 depicted as bond wires that are in direct contact with the second chip 1332 and in direct contact with the substrate 1302. The second chip 1332 can be connected along a single side peripheral to the integrated circuit 1308, the first interconnects 1314, and the first chip 1326.

It has been discovered that utilizing the integrated circuit 1308 between the sides 1304 and in combination with the first chip 1326 and with the second chip 1332 offset provides reduced package size and foot print. It has been further discovered that utilizing the integrated circuit 1308 between the sides 1304 and in combination with the first chip 1326 and with the second chip 1332 offset provides reduced interconnection length decreasing manufacturing costs and undesirable electric characteristics.

Above the first chip 1326 and the second chip 1332 is a second intermediate layer 1336 depicted as an integrated circuit attach adhesive. Above the second intermediate layer 1336 is a third chip 1338 depicted as a wire-bonded integrated circuit chip having active circuitry on a top portion. The third chip 1338 extends over, above, and laterally beyond the sides 1304 of the substrate 1302 that face each other, the integrated circuit 1308 and is horizontally offset in the same direction as the second chip 1332, along with the second intermediate layer 1336, from the first chip 1326 and the second chip 1332. The third chip 1338 and the second intermediate layer 1336 are sufficiently offset from the second chip 1332 to provide room for the third interconnects 1334 to connect to the second chip 1332 without obstruction from the third chip 1338 and the second intermediate layer 1336.

The third chip 1338 is electrically connected from above to the top surface 1318 of the substrate 1302 with fourth interconnects 1340 depicted as bond wires that are in direct contact with the third chip 1338 and in direct contact with the substrate 1302. The third chip 1338 can be connected along a single side peripheral to the integrated circuit 1308 and the first interconnects 1314.

It has been discovered that utilizing the integrated circuit 1308 between the sides 1304 and in combination with the first chip 1326, the second chip 1332, and the third chip 1338 offset provides reduced package size and foot print. It has been further discovered that utilizing the integrated circuit 1308 between the sides 1304 and in combination with the first chip 1326, the second chip 1332, and the third chip 1338 offset provides reduced interconnection length decreasing manufacturing costs and undesirable electric characteristics.

Above the first chip 1326, the second chip 1332, and the third chip 1338 is a third intermediate layer 1342 depicted as an integrated circuit attach adhesive. Above the third intermediate layer 1342 is a fourth chip 1344 depicted as a wire-bonded integrated circuit chip having active circuitry on a top portion. The fourth chip 1344 extends over, above, and laterally beyond the sides 1304 of the substrate 1302 that face each other, the integrated circuit 1308 and is horizontally offset in the same direction as the third chip 1338, along with the third intermediate layer 1342, from the first chip 1326, the second chip 1332, and the third chip 1338. The fourth chip 1344 and the third intermediate layer 1342 are sufficiently offset from the third chip 1338 to provide room for the fourth interconnects 1340 to connect to the third chip 1338 without obstruction from the fourth chip 1344 and the third intermediate layer 1342.

The fourth chip 1344 is electrically connected from above to the top surface 1318 of the substrate 1302 with fifth interconnects 1346 depicted as bond wires that are in direct contact with the fourth chip 1344 and in direct contact with the substrate 1302. The fourth chip 1344 can be connected along a single side peripheral to the integrated circuit 1308 and the first interconnects 1314.

It has been discovered that utilizing the integrated circuit 1308 between the sides 1304 and in combination with the first chip 1326, the second chip 1332, the third chip 1338, and the fourth chip 1344 offset provides reduced package size and foot print. It has been further discovered that utilizing the integrated circuit 1308 between the sides 1304 and in combination with the first chip 1326, the second chip 1332, the third chip 1338, and the fourth chip 1344 offset provides reduced interconnection length decreasing manufacturing costs and undesirable electric characteristics.

The third interconnects 1334 are depicted peripheral to the second interconnects 1328. The fourth interconnects 1340 are depicted peripheral to the second interconnects 1328, and the third interconnects 1334. The fifth interconnects 1346 are depicted peripheral to the second interconnects 1328, the third interconnects 1334, and the fourth interconnects 1340.

Above and around the first chip 1326, the second chip 1332, the third chip 1338, and the fourth chip 1344 is an encapsulation 1348. The encapsulation 1348 is defined as a structure that protects sensitive components from moisture, dust and other contamination. The encapsulation 1348 can be glob top, film assist molding, or other encasement structures.

The encapsulation 1348 further encapsulates the second interconnects 1328, the third interconnects 1334, the fourth interconnects 1340, and the fifth interconnects 1346. The encapsulation 1348 encapsulates portions of the top surface 1318 of the substrate 1302. Below the substrate 1302 external interconnects 1350, depicted as solder balls, are mounted.

Figure 14:
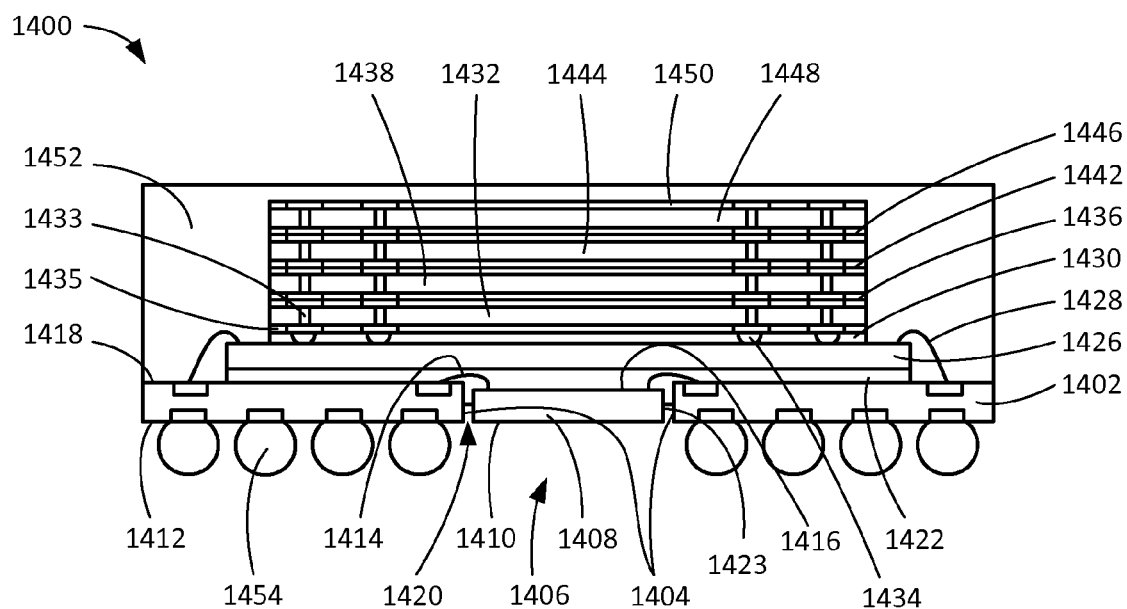
FIG. 14 is a cross-sectional view of an integrated circuit packaging system in a fifth embodiment of the present invention.

Referring now to FIG. 14, therein is shown a cross-sectional view of an integrated circuit packaging system 1400 in a fifth embodiment of the present invention. The integrated circuit packaging system 1400 is shown having a substrate 1402. The substrate 1402 is defined as a structure capable of electrically connection, signal routing, and providing structural support for components to be mounted thereto. The substrate 1402 can be but is not limited to laminated plastic or ceramic.

The substrate 1402 is shown having sides 1404 that face each other bounding a through hole 1406 of the substrate 1402. Between the sides 1404 an integrated circuit 1408 is positioned and without contact between the integrated circuit 1408 and the sides 1404. The integrated circuit 1408 is depicted as a wire-bonded integrated circuit die with an inactive side 1410 coplanar with a bottom surface 1412 of the substrate 1402.

The integrated circuit 1408 is electrically connected to the substrate 1402 with first interconnects 1414 depicted as bond wires that are in direct contact with an active side 1416 of the integrated circuit 1408 and in direct contact with the substrate 1402. The active side 1416 is defined as a surface having active circuitry. Active circuitry is defined as including transistor elements. The active side 1416 of the integrated circuit 1408 is below a top surface 1418 of the substrate 1402. Between the integrated circuit 1408 and the sides 1404 of the substrate 1402 there is a space 1420 that is open, unfilled, void, or empty. The integrated circuit 1408 is therefore exposed between the sides 1404 of the substrate 1402.

It has been discovered that positioning the integrated circuit 1408 below the top surface 1418 of the substrate 1402 provides shorter wire sweeps eliminating inadvertent shorting and wire breakage and shorter package height due to reduced clearance needs of the first interconnects 1414. Further, it has been discovered that positioning the integrated circuit 1408 below the top surface 1418 of the substrate 1402 reduces costs of manufacture by reducing the amount of material used to manufacture the first interconnects 1414. Yet further, it has been discovered that positioning the integrated circuit 1408 below the top surface 1418 of the substrate 1402 reduces parasitic inductance during high frequency data transmission by reducing the length of the first interconnects 1414.

The integrated circuit 1408 is covered by a wire-in-film adhesive 1422. The wire-in-film adhesive 1422 is defined as a material that can be hardened after curing and can maintain a predetermined thickness. The wire-in-film adhesive 1422 is depicted as a B-stage material. B-stage material is defined as a thermosetting resin that softens when heated and able to expand in the presence of certain fluids and may be cured by the cross-linking of polymers. The wire-in-film adhesive 1422 can be pre-formed to a thickness less than the thickness of the substrate 1402 or the integrated circuit 1408. Pre-forming is defined as an intermediate stage of reaction of a thermosetting resin that is not in a liquid or fluid like state but is a moldable solid.

The wire-in-film adhesive 1422 is in direct contact with the active side 1416 of the integrated circuit 1408 and is cured around the first interconnects 1414. The wire-in-film adhesive 1422 is also in direct contact with the top surface 1418 of the substrate 1402, with the sides 1404 of the substrate 1402, and with the integrated circuit 1408 near the top surface 1418 of the substrate 1402. Further, vertical sides 1423 of the integrated circuit 1408 and the inactive side 1410 of the integrated circuit 1408 are exposed from the wire-in-film adhesive 1422.

The inactive side 1410 is shown fully exposed or 100% of the inactive side is exposed from the wire-in-film adhesive 1422. The vertical sides 1423 of the integrated circuit 1408 can also be fully exposed from the wire-in-film adhesive 1422 but are depicted as partially covered with the wire-in-film adhesive 1422 to improve mechanical reliability and partially exposed from the wire-in-film adhesive 1422 to improve heat dissipation. Active circuitry on the active side 1416 should be fully covered by the wire-in-film adhesive 1422 to ensure there is no moisture absorption and that the sensitive active components are protected.

It has been discovered that the wire-in-film adhesive 1422 encasing portions of the integrated circuit 1408 provide encasement protection for dust, moisture, and other environmental elements. It has been further discovered that the wire-in-film adhesive 1422 encasing portions of the integrated circuit 1408 provide high reliability for the integrated circuit 1408, while leaving the integrated circuit 1408 partially exposed provides increased thermal cooling and performance.

Above the substrate 1402 and the integrated circuit 1408 is a first chip 1426 depicted as a wire-bonded integrated circuit chip having active circuitry on a top portion. The first chip 1426 extends over, above, and laterally beyond the sides 1404 of the substrate 1402 that face each other and the integrated circuit 1408.

The first chip 1426 is electrically connected from above to the top surface 1418 of the substrate 1402 with second interconnects 1428 depicted as bond wires that are in direct contact with the first chip 1426 and in direct contact with the substrate 1402. The first chip 1426 is connected peripheral to the integrated circuit 1408, and the first interconnects 1414.

Above the first chip 1426 is an intermediate layer 1430 depicted as an under-fill for additional rigidity. Above the intermediate layer 1430 is a second chip 1432 depicted as a through silicon via chip having first vias 1433 through the second chip 1432. The second chip 1432 extends over, above, and laterally beyond the sides 1404 of the substrate 1402 that face each other and the integrated circuit 1408, and is in vertical alignment with the first chip 1426. The second chip 1432 is further depicted as laterally smaller than the first chip 1426. Vertical alignment is defined as the mean location of mass of a first component along a vertical line of the mean location of mass of a second component.

The second chip 1432 is electrically connected from below to the first chip 1426 with third interconnects 1434 depicted as solder bumps that are in direct contact with a first re-distribution layer 1435 on the second chip 1432 and in direct contact with the first chip 1426. The second chip 1432 is connected peripheral to the integrated circuit 1408 but not peripheral to the first interconnects 1414 and the first chip 1426.

It has been discovered that utilizing the integrated circuit 1408 between the sides 1404 and in combination with the first chip 1426 and with the second chip 1432 provides reduced package size and foot print. It has been further discovered that utilizing the integrated circuit 1408 between the sides 1404 and in combination with the first chip 1426 and with the second chip 1432 provides reduced interconnection length decreasing manufacturing costs and undesirable electric characteristics.

Above the second chip 1432 and in direct contact therewith and with the first vias 1433 is a second re-distribution layer 1436. A re-distribution layer 1436 is defined as layers that route electrical signals within a predefined even thickness. Above the second re-distribution layer 1436 is a third chip 1438 depicted as a through silicon via chip having vias there through.

The third chip 1438 can extend over, above, and laterally beyond the sides 1404 of the substrate 1402 that face each other and the integrated circuit 1408, and can be in vertical alignment with the first chip 1426 and with the second chip 1432. The third chip 1438 is electrically connected to the second chip 1432 by direct contact with the second re-distribution layer 1436.

It has been discovered that utilizing the integrated circuit 1408 between the sides 1404 and in combination with the first chip 1426, the second chip 1432, and the third chip 1438 provides reduced package size and foot print. It has been further discovered that utilizing the integrated circuit 1408 between the sides 1404 and in combination with the first chip

1426, the second chip 1432, and the third chip 1438 provides reduced interconnection length decreasing manufacturing costs and undesirable electric characteristics.

Above the first chip 1426, the second chip 1432, and the third chip 1438 is a third re-distribution layer 1442. Above the third re-distribution layer 1442 is a fourth chip 1444 depicted as a through silicon via chip having vias there through. The fourth chip 1444 extends over, above, and laterally beyond the sides 1404 of the substrate 1402 that face each other and the integrated circuit 1408, and can be in vertical alignment and coplanar with the first chip 1426, with the second chip 1432, and with the third chip 1438. The fourth chip 1444 is electrically connected to the third chip 1438 by direct contact with the third re-distribution layer 1442.

It has been discovered that utilizing the integrated circuit 1408 between the sides 1404 and in combination with the first chip 1426, the second chip 1432, the third chip 1438, and the fourth chip 1444 provides reduced package size and foot print. It has been further discovered that utilizing the integrated circuit 1408 between the sides 1404 and in combination with the first chip 1426, the second chip 1432, the third chip 1438, and the fourth chip 1444 provides reduced interconnection length decreasing manufacturing costs and undesirable electric characteristics.

Above the first chip 1426, the second chip 1432, the third chip 1438, and the fourth chip 1444 is a fourth re-distribution layer 1446. Above the fourth re-distribution layer 1446 is a fifth chip 1448 depicted as a through silicon via chip having vias there through. The fifth chip 1448 extends over, above, and laterally beyond the sides 1404 of the substrate 1402 that face each other and the integrated circuit 1408, and can be in vertical alignment and coplanar with the first chip 1426, with the second chip 1432, and with the third chip 1438.

The fifth chip 1448 is electrically connected to the fourth chip 1444 by direct contact with the fourth re-distribution layer 1446. Above the fifth chip 1448 is a fifth re-distribution layer 1450 in direct contact with the fifth chip 1448.

Above and around the first chip 1426, the second chip 1432, the third chip 1438, the fourth chip 1444, and the fifth chip 1448 is an encapsulation 1452. The encapsulation 1452 is defined as a structure that protects sensitive components from moisture, dust and other contamination. The encapsulation 1452 can be glob top, film assist molding, or other encasement structures. Below the substrate 1402 external interconnects 1454, depicted as solder balls, are mounted.

Figure 15:
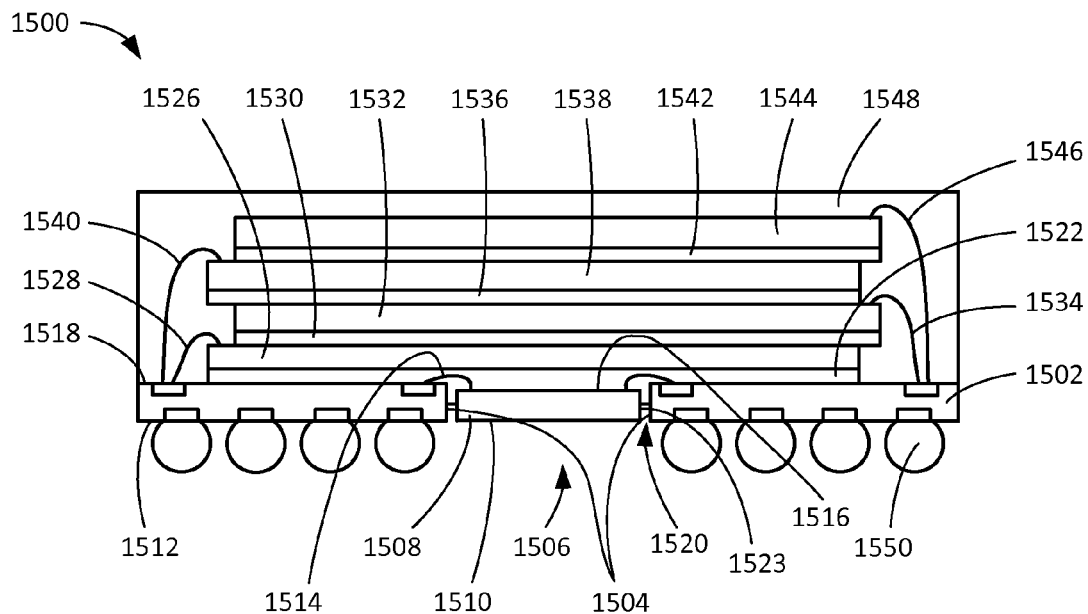
FIG. 15 is a cross-sectional view of an integrated circuit packaging system in a sixth embodiment of the present invention.

Referring now to FIG. 15, therein is shown a cross-sectional view of an integrated circuit packaging system 1500 in a sixth embodiment of the present invention. The integrated circuit packaging system 1500 is shown having a substrate 1502. The substrate 1502 is defined as a structure capable of electrically connection, signal routing, and providing structural support for components to be mounted thereto. The substrate 1502 can be but is not limited to laminated plastic or ceramic.

The substrate 1502 is shown having sides 1504 that face each other bounding a through hole 1506 of the substrate 1502. Between the sides 1504 an integrated circuit 1508 is positioned and without contact between the integrated circuit 1508 and the sides 1504. The integrated circuit 1508 is depicted as a wire-bonded integrated circuit die with an inactive side 1510 coplanar with a bottom surface 1512 of the substrate 1502.

The integrated circuit 1508 is electrically connected to the substrate 1502 with first interconnects 1514 depicted as bond wires that are in direct contact with an active side 1516 of the integrated circuit 1508 and in direct contact with the substrate 1502. The active side 1516 is defined as a surface having active circuitry. Active circuitry is defined as including transistor elements. The active side 1516 of the integrated circuit 1508 is below a top surface 1518 of the substrate 1502. Between the integrated circuit 1508 and the sides 1504 of the substrate 1502 there is a space 1520 that is open, unfilled, void, or empty. The integrated circuit 1508 is therefore exposed between the sides 1504 of the substrate 1502.

It has been discovered that positioning the integrated circuit 1508 below the top surface 1518 of the substrate 1502 provides shorter wire sweeps eliminating inadvertent shorting and wire breakage and shorter package height due to reduced clearance needs of the first interconnects 1514. Further, it has been discovered that positioning the integrated circuit 1508 below the top surface 1518 of the substrate 1502 reduces costs of manufacture by reducing the amount of material used to manufacture the first interconnects 1514. Yet further, it has been discovered that positioning the integrated circuit 1508 below the top surface 1518 of the substrate 1502 reduces parasitic inductance during high frequency data transmission by reducing the length of the first interconnects 1514.

The integrated circuit 1508 is covered by a wire-in-film adhesive 1522. The wire-in-film adhesive 1522 is defined as a material that can be hardened after curing and can maintain a predetermined thickness. The wire-in-film adhesive 1522 is depicted as a B-stage material. B-stage material is defined as a thermosetting resin that softens when heated and able to expand in the presence of certain fluids and may be cured by the cross-linking of polymers. The wire-in-film adhesive 1522 can be pre-formed to a thickness less than the thickness of the substrate 1502 or the integrated circuit 1508. Pre-forming is defined as an intermediate stage of reaction of a thermosetting resin that is not in a liquid or fluid like state but is a moldable solid.

The wire-in-film adhesive 1522 is in direct contact with the active side 1516 of the integrated circuit 1508 and is cured around the first interconnects 1514. The wire-in-film adhesive 1522 is also in direct contact with the top surface 1518 of the substrate 1502, with the sides 1504 of the substrate 1502, and with the integrated circuit 1508 near the top surface 1518 of the substrate 1502. Further, vertical sides 1523 of the integrated circuit 1508 and the inactive side 1510 of the integrated circuit 1508 are exposed from the wire-in-film adhesive 1522.

The inactive side 1510 is shown fully exposed or 100% of the inactive side is exposed from the wire-in-film adhesive 1522. The vertical sides 1523 of the integrated circuit 1508 can also be fully exposed from the wire-in-film adhesive 1522 but are depicted as partially covered with the wire-in-film adhesive 1522 to improve mechanical reliability and partially exposed from the wire-in-film adhesive 1522 to improve heat dissipation. Active circuitry on the active side 1516 should be fully covered by the wire-in-film adhesive 1522 to ensure there is no moisture absorption and that the sensitive active components are protected.

It has been discovered that the wire-in-film adhesive 1522 encasing portions of the integrated circuit 1508 provide encasement protection for dust, moisture, and other environmental elements. It has been further discovered that the wire-in-film adhesive 1522 encasing portions of the integrated circuit 1508 provide high reliability for the integrated circuit 1508, while leaving the integrated circuit 1508 partially exposed provides increased thermal cooling and performance.

Above the substrate 1502 and the integrated circuit 1508 is a first chip 1526 depicted as a wire-bonded integrated circuit chip having active circuitry on a top portion. The first chip 1526 extends over, above, and laterally beyond the sides 1504 of the substrate 1502 that face each other and the integrated circuit 1508.

The first chip 1526 is electrically connected from above to the top surface 1518 of the substrate 1502 with second interconnects 1528 depicted as bond wires that are in direct contact with the first chip 1526 and in direct contact with the substrate 1502. The first chip 1526 can be connected along a single side peripheral to the integrated circuit 1508 and the first interconnects 1514.

Above the first chip 1526 is a first intermediate layer 1530 depicted as an integrated circuit attach adhesive. Above the first intermediate layer 1530 is a second chip 1532 depicted as a wire-bonded integrated circuit chip having active circuitry on a top portion. The second chip 1532 extends over, above, and laterally beyond the sides 1504 of the substrate 1502 that face each other, the integrated circuit 1508 and is horizontally offset along with the first intermediate layer 1530 from the first chip 1526. The second chip 1532 and the first intermediate layer 1530 are sufficiently offset from the first chip 1526 to provide room for the second interconnects 1528 to connect to the first chip 1526 without obstruction from the second chip 1532 and the first intermediate layer 1530.

The second chip 1532 is electrically connected from above to the top surface 1518 of the substrate 1502 with third interconnects 1534 depicted as bond wires that are in direct contact with the second chip 1532 and in direct contact with the substrate 1502. The second chip 1532 can be connected along a single side peripheral to the integrated circuit 1508 and the first chip 1526.

It has been discovered that utilizing the integrated circuit 1508 between the sides 1504 and in combination with the first chip 1526 and with the second chip 1532 offset provides reduced package size and foot print. It has been further discovered that utilizing the integrated circuit 1508 between the sides 1504 and in combination with the first chip 1526 and with the second chip 1532 offset provides reduced interconnection length decreasing manufacturing costs and undesirable electric characteristics.

Above the first chip 1526 and the second chip 1532 is a second intermediate layer 1536 depicted as an integrated circuit attach adhesive. Above the second intermediate layer 1536 is a third chip 1538 depicted as a wire-bonded integrated circuit chip having active circuitry on a top portion. The third chip 1538 extends over, above, and laterally beyond the sides 1504 of the substrate 1502 that face each other, the integrated circuit 1508 and is horizontally offset in the opposite direction as the second chip 1532, along with the second intermediate layer 1536. The third chip 1538 and the second intermediate layer 1536 are sufficiently offset from the second chip 1532 to provide room for the third interconnects 1534 to connect to the second chip 1532 without obstruction from the third chip 1538 and the second intermediate layer 1536.

The third chip 1538 is electrically connected from above to the top surface 1518 of the substrate 1502 with fourth interconnects 1540 depicted as bond wires that are in direct contact with the third chip 1538 and in direct contact with the substrate 1502. The third chip 1538 can be connected along a single side peripheral to the integrated circuit 1508 and the first interconnects 1514.

It has been discovered that utilizing the integrated circuit 1508 between the sides 1504 and in combination with the first chip 1526, the second chip 1532, and the third chip 1538 offset provides reduced package size and foot print. It has been further discovered that utilizing the integrated circuit 1508 between the sides 1504 and in combination with the first chip 1526, the second chip 1532, and the third chip 1538 offset provides reduced interconnection length decreasing manufacturing costs and undesirable electric characteristics.

Above the first chip 1526, the second chip 1532, and the third chip 1538 is a third intermediate layer 1542 depicted as an integrated circuit attach adhesive. Above the third intermediate layer 1542 is a fourth chip 1544 depicted as a wire-bonded integrated circuit chip having active circuitry on a top portion. The fourth chip 1544 extends over, above, and laterally beyond the sides 1504 of the substrate 1502 that face each other, the integrated circuit 1508 and is horizontally offset in the opposite direction as the third chip 1538, along with the third intermediate layer 1542. The fourth chip 1544 and the third intermediate layer 1542 are sufficiently offset from the third chip 1538 to provide room for the fourth interconnects 1540 to connect to the third chip 1538 without obstruction from the fourth chip 1544 and the third intermediate layer 1542.

The fourth chip 1544 is electrically connected from above to the top surface 1518 of the substrate 1502 with fifth interconnects 1546 depicted as bond wires that are in direct contact with the fourth chip 1544 and in direct contact with the substrate 1502. The fourth chip 1544 can be connected along a single side peripheral to the integrated circuit 1508 and the third interconnects 1534.

It has been discovered that utilizing the integrated circuit 1508 between the sides 1504 and in combination with the first chip 1526, the second chip 1532, the third chip 1538, and the fourth chip 1544 offset provides reduced package size and foot print. It has been further discovered that utilizing the integrated circuit 1508 between the sides 1504 and in combination with the first chip 1526, the second chip 1532, the third chip 1538, and the fourth chip 1544 offset provides reduced interconnection length decreasing manufacturing costs and undesirable electric characteristics.

Above and around the first chip 1526, the second chip 1532, the third chip 1538, and the fourth chip 1544 is an encapsulation 1548. The encapsulation 1548 is defined as a structure that protects sensitive components from moisture, dust and other contamination. The encapsulation 1548 can be glob top, film assist molding, or other encasement structures.

The encapsulation 1548 further encapsulates the second interconnects 1528, the third interconnects 1534, the fourth interconnects 1540, and the fifth interconnects 1546. The encapsulation 1548 encapsulates portions of the top surface 1518 of the substrate 1502. Below the substrate 1502 external interconnects 1550, depicted as solder balls, are mounted.

Figure 16:
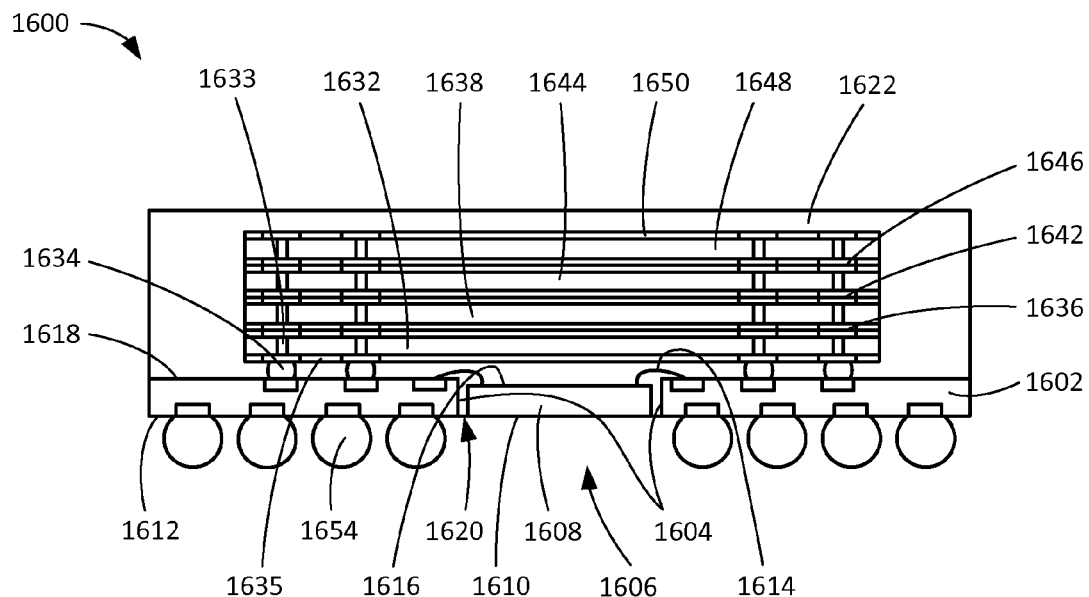
FIG. 16 is a cross-sectional view of an integrated circuit packaging system in a seventh embodiment of the present invention.

Referring now to FIG. 16, therein is shown a cross-sectional view of an integrated circuit packaging system 1600 in a seventh embodiment of the present invention. The integrated circuit packaging system 1600 is shown having a substrate 1602. The substrate 1602 is defined as a structure capable of electrically connection, signal routing, and providing structural support for components to be mounted thereto. The substrate 1602 can be but is not limited to laminated plastic or ceramic.

The substrate 1602 is shown having sides 1604 that face each other bounding a through hole 1606 of the substrate 1602. Between the sides 1604 an integrated circuit 1608 is positioned and without contact between the integrated circuit 1608 and the sides 1604. The integrated circuit 1608 is depicted as a wire-bonded integrated circuit die with an inactive side 1610 coplanar with a bottom surface 1612 of the substrate 1602.

The integrated circuit 1608 is electrically connected to the substrate 1602 with first interconnects 1614 depicted as bond wires that are in direct contact with an active side 1616 of the integrated circuit 1608 and in direct contact with the substrate 1602. The active side 1616 is defined as a surface having active circuitry. Active circuitry is defined as including transistor elements. The active side 1616 of the integrated circuit 1608 is below a top surface 1618 of the substrate 1602.

It has been discovered that positioning the integrated circuit 1608 below the top surface 1618 of the substrate 1602 provides shorter wire sweeps eliminating inadvertent shorting and wire breakage and shorter package height due to reduced clearance needs of the first interconnects 1614. Further, it has been discovered that positioning the integrated circuit 1608 below the top surface 1618 of the substrate 1602 reduces costs of manufacture by reducing the amount of material used to manufacture the first interconnects 1614. Yet further, it has been discovered that positioning the integrated circuit 1608 below the top surface 1618 of the substrate 1602 reduces parasitic inductance during high frequency data transmission by reducing the length of the first interconnects 1614.

Between the integrated circuit 1608 and the sides 1604 of the substrate 1602 there is a space 1620 that is filled with a material 1622 depicted as an encapsulation. The material 1622 or encapsulation is defined as a structure that protects sensitive components from moisture, dust and other contamination. The material 1622 can be glob top, film assist molding, or other encasement structures.

The integrated circuit 1608 is covered by the material 1622. The material 1622 is in direct contact with the active side 1616 of the integrated circuit 1608 and encapsulates the first interconnects 1614. The material 1622 is also in direct contact with the top surface 1618 of the substrate 1602 and with the sides 1604 of the substrate 1602.

It has been discovered that the material 1622 encasing portions of the integrated circuit 1608 provide encasement protection for dust, moisture, and other environmental elements. It has been further discovered that the material 1622 encasing portions of the integrated circuit 1608 provide high reliability for the integrated circuit 1608, while leaving the integrated circuit 1608 partially exposed provides increased thermal cooling and performance.

Above the substrate 1602 and the integrated circuit 1608 is a first chip 1632 depicted as a through silicon via chip having first vias 1633 through the first chip 1632. The first chip 1632 extends over, above, and laterally beyond the sides 1604 of the substrate 1602 that face each other and the integrated circuit 1608.

The first chip 1632 is electrically connected from below to the substrate 1602 with second interconnects 1634 depicted as solder bumps that are in direct contact with a first re-distribution layer 1635 on the first chip 1632 and in direct contact with the substrate 1602. A first re-distribution layer 1635 is defined as layers that route electrical signals within a predefined even thickness. The first chip 1632 is connected peripheral to the integrated circuit 1608.

Above the first chip 1632 and in direct contact therewith is a second re-distribution layer 1636. Above the second re-distribution layer 1636 is a second chip 1638 depicted as a through silicon via chip having vias there through.

The second chip 1638 can extend over, above, and laterally beyond the sides 1604 of the substrate 1602 that face each other and the integrated circuit 1608, and can be in vertical alignment with the first chip 1632. The second chip 1638 is electrically connected to the first chip 1632 by direct contact with the second re-distribution layer 1636.

It has been discovered that utilizing the integrated circuit 1608 between the sides 1604 and in combination with the first chip 1632, and the second chip 1638 provides reduced package size and foot print. It has been further discovered that utilizing the integrated circuit 1608 between the sides 1604 and in combination with the first chip 1632, and the second chip 1638 provides reduced interconnection length decreasing manufacturing costs and undesirable electric characteristics.

Above the first chip 1632, and the second chip 1638 is a third re-distribution layer 1642. Above the third re-distribution layer 1642 is a third chip 1644 depicted as a through silicon via chip having vias there through. The third chip 1644 extends over, above, and laterally beyond the sides 1604 of the substrate 1602 that face each other and the integrated circuit 1608, and can be in vertical alignment and coplanar with the first chip 1632, and with the second chip 1638. The third chip 1644 is electrically connected to the second chip 1638 by direct contact with the third re-distribution layer 1642.

It has been discovered that utilizing the integrated circuit 1608 between the sides 1604 and in combination with the first chip 1632, the second chip 1638, and the third chip 1644 provides reduced package size and foot print. It has been further discovered that utilizing the integrated circuit 1608 between the sides 1604 and in combination with the first chip 1632, the second chip 1638, and the third chip 1644 provides reduced interconnection length decreasing manufacturing costs and undesirable electric characteristics.

Above the first chip 1632, the second chip 1638, and the third chip 1644 is a fourth re-distribution layer 1646. Above the fourth re-distribution layer 1646 is a fourth chip 1648 depicted as a through silicon via chip having vias there through. The fourth chip 1648 extends over, above, and laterally beyond the sides 1604 of the substrate 1602 that face each other and the integrated circuit 1608, and can be in vertical alignment and coplanar with the first chip 1632, and with the second chip 1638.

The fourth chip 1648 is electrically connected to the third chip 1644 by direct contact with the fourth re-distribution layer 1646. Above the fourth chip 1648 is a fifth re-distribution layer 1650 in direct contact with the fourth chip 1648.

Above and around the first chip 1632, the second chip 1638, the third chip 1644, and the fourth chip 1648 is the material 1622. Below the substrate 1602 external interconnects 1654, depicted as solder balls, are mounted.

Figure 17:
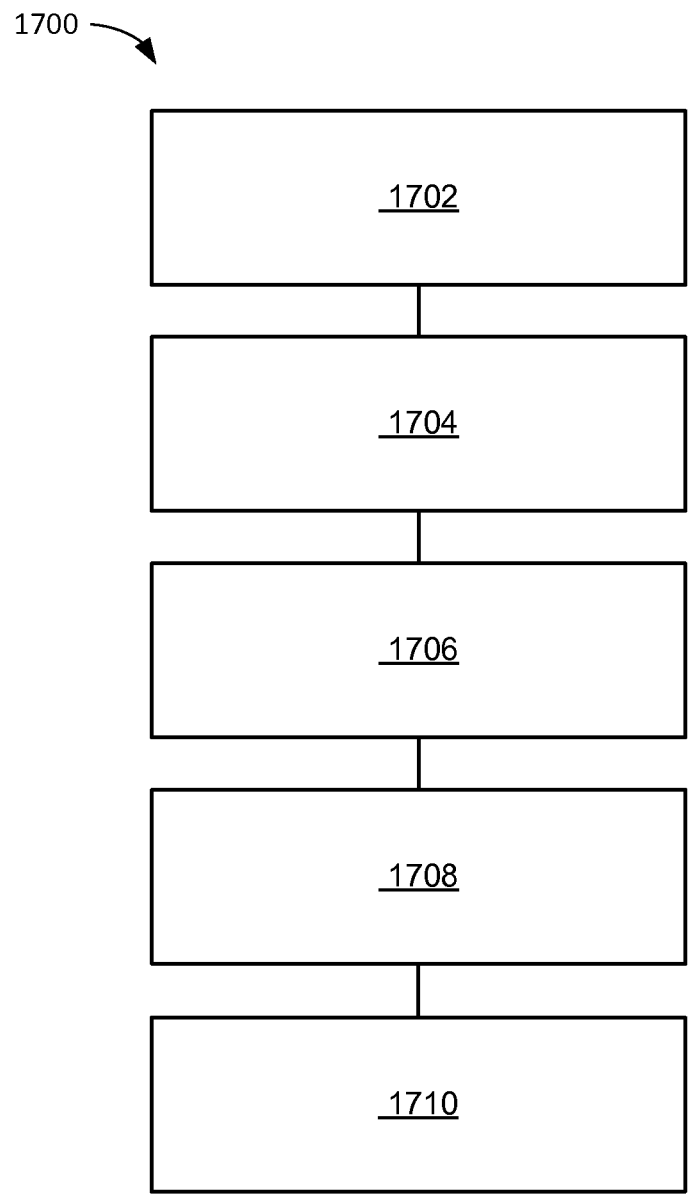
FIG. 17 is a flow chart of a method of manufacture of the integrated circuit packaging system of FIG. 1 in a further embodiment of the present invention.

Referring now to FIG. 17, therein is shown a flow chart of a method 1700 of manufacture of the integrated circuit packaging system 100 of FIG. 1 in a further embodiment of the present invention. The method 1700 includes: providing a substrate having a through hole in a block 1702; mounting an integrated circuit in the through hole, the integrated circuit having an inactive side and a vertical side in a block 1704; connecting a first interconnect in direct contact with the integrated circuit and the substrate in a block 1706; applying a wire-in-film adhesive around and above the integrated circuit leaving a portion of the vertical side and the inactive side exposed and covering a portion of the first interconnect in a block 1708; and mounting a chip above the integrated circuit and in direct contact with the wire-in-film adhesive in a block 1710.

Thus, it has been discovered that the fan in interposer on lead system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate having a through hole;
   mounting an integrated circuit in the through hole, the integrated circuit having an inactive side and a vertical side;
   connecting a first interconnect in direct contact with the integrated circuit and the substrate;
   applying a wire-in-film adhesive around and above the integrated circuit leaving a portion of the vertical side and the inactive side exposed and covering a portion of the first interconnect; and
   mounting a chip above the integrated circuit and in direct contact with the wire-in-film adhesive.

2. The method as claimed in claim 1 wherein applying the wire-in-film adhesive includes pre-forming the wire-in-film adhesive to a thickness less than the thickness of the substrate.

3. The method as claimed in claim 1 wherein:
   mounting the chip includes mounting a first chip; and
further comprising:
   mounting a second chip above the integrated circuit and above the first chip with the second chip in vertical alignment with the first chip.

4. The method as claimed in claim 1 further comprising attaching a heat sink in direct contact with the inactive side of the integrated circuit.

5. The method as claimed in claim 1 further comprising attaching a passive component in direct contact with the substrate.

6. A method of manufacture of an integrated circuit packaging system comprising:
   providing a substrate having a through hole;
   mounting the substrate to a coverlay tape;
   mounting an integrated circuit in the through hole and to the coverlay tape, the integrated circuit having an inactive side and a vertical side;
   connecting a bond wire in direct contact with the integrated circuit and the substrate;
   applying a wire-in-film adhesive around and above the integrated circuit leaving a portion of the vertical side and the inactive side exposed and covering a portion of the bond wire;
   mounting a chip above the integrated circuit and in direct contact with the wire-in-film adhesive;
   encapsulating the chip with an encapsulation above the substrate; and
   mounting external interconnects below the substrate.

7. The method as claimed in claim 6 wherein applying the wire-in-film adhesive includes pre-forming the wire-in-film adhesive to a thickness less than the thickness of the integrated circuit.

8. The method as claimed in claim 6 wherein:
   mounting the chip includes mounting a first chip; and
further comprising:
   mounting a second chip connected peripheral to the integrated circuit and directly to the first chip with solder bumps.

9. The method as claimed in claim 6 wherein mounting the first chip includes mounting a wire-bonded integrated circuit chip or a through silicon via chip.

10. The method as claimed in claim 6 wherein:
   mounting the chip includes mounting a first chip; and
further comprising:
   mounting a second chip horizontally offset from the first chip.

* * * * *